(12) United States Patent
Nishijima et al.

(10) Patent No.: US 12,215,226 B2
(45) Date of Patent: Feb. 4, 2025

(54) CURABLE REACTIVE SILICONE COMPOSITION, CURED PRODUCT THEREOF AND USES OF COMPOSITION AND CURED PRODUCT

(71) Applicant: DOW TORAY CO., LTD., Tokyo (JP)

(72) Inventors: Kazuhiro Nishijima, Ichihara (JP); Akihiro Nakamura, Ichihara (JP); Haruhiko Furukawa, Ichihara (JP); Makoto Yoshitake, Ichihara (JP); Toru Imaizumi, Ichihara (JP); Kouichi Ozaki, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 938 days.

(21) Appl. No.: 17/288,503

(22) PCT Filed: Oct. 29, 2019

(86) PCT No.: PCT/JP2019/042320
§ 371 (c)(1),
(2) Date: Sep. 6, 2021

(87) PCT Pub. No.: WO2020/090797
PCT Pub. Date: May 7, 2020

(65) Prior Publication Data
US 2022/0340756 A1     Oct. 27, 2022

(30) Foreign Application Priority Data

Oct. 30, 2018   (JP) ................................ 2018-203771
Mar. 22, 2019   (JP) ................................ 2019-054633

(51) Int. Cl.
| | |
|---|---|
| C08L 83/04 | (2006.01) |
| B29C 55/00 | (2006.01) |
| B29C 55/02 | (2006.01) |
| B29K 83/00 | (2006.01) |
| B29L 7/00 | (2006.01) |
| B29L 9/00 | (2006.01) |
| B32B 7/12 | (2006.01) |
| B32B 17/10 | (2006.01) |
| B32B 37/12 | (2006.01) |
| B32B 38/00 | (2006.01) |
| B32B 38/06 | (2006.01) |
| C09J 7/38 | (2018.01) |
| C09J 183/04 | (2006.01) |

(52) U.S. Cl.
CPC ............ *C08L 83/04* (2013.01); *B29C 55/005* (2013.01); *B29C 55/023* (2013.01); *B32B 7/12* (2013.01); *B32B 17/10036* (2013.01); *B32B 17/10798* (2013.01); *B32B 17/10917* (2013.01); *B32B 37/1207* (2013.01); *B32B 37/1284* (2013.01); *B32B 38/0012* (2013.01); *B32B 38/06* (2013.01); *C09J 7/38* (2018.01); *C09J 183/04* (2013.01); *B29K 2083/00* (2013.01); *B29L 2007/002* (2013.01); *B29L 2009/00* (2013.01); *B32B 2037/1215* (2013.01); *B32B 2305/72* (2013.01); *B32B 2307/54* (2013.01); *B32B 2310/0806* (2013.01); *B32B 2383/00* (2013.01); *B32B 2457/12* (2013.01); *B32B 2457/20* (2013.01); *C08L 2203/16* (2013.01); *C08L 2205/025* (2013.01); *C08L 2205/03* (2013.01); *C09J 2483/00* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,145,886 | A | * | 9/1992 | Oxman ................... A61K 6/76 522/66 |
| 5,169,727 | A | | 12/1992 | Boardman |

(Continued)

FOREIGN PATENT DOCUMENTS

| | | |
|---|---|---|
| AU | 618818 B2 | 1/1992 |
| CN | 101151328 A | 3/2008 |

(Continued)

OTHER PUBLICATIONS

English translation of International Search Report for PCT/JP2019/042320 dated Mar. 24, 2020, 2 pages.
Machine assisted English translation of JP2010047676A obtained from https://patents.google.com/patent on Jul. 21, 2021, 9 pages.
Machine assisted English translation of JP2015214637A obtained from https://patents.google.com/patent on Jul. 21, 2021, 11 pages.

(Continued)

*Primary Examiner* — Liam J Heincer
(74) *Attorney, Agent, or Firm* — WARNER NORCROSS + JUDD LLP

(57) ABSTRACT

Provided is: a curing reactive silicone composition having sufficient toughness and pressure sensitive adhesive strength to temporarily secure various substrate even in an uncured state, having heat meltability and excellent moldability of a sheet or the like, and that can be quickly cured by high energy irradiation to achieve high adhesive strength; a method of manufacturing a sheet thereof a cured product thereof that can achieve high adhesive strength by crimping; and applications thereof. The curing reactive silicone composition comprises: (A) an MQ resin; (B) a chain organopolysiloxane having at least two groups containing an aliphatic unsaturated carbon-carbon bond, and a degree of siloxane polymerization within a range of 80 to 3000; (C) an organohydrogenpolysiloxane; and (D) a hydrosilylation reaction catalyst activated by a high energy beam. The amount of component (A) is more than 55 mass % and less than 90 mass % of the sum of components (A) to (C).

19 Claims, 5 Drawing Sheets

(56) References Cited

U.S. PATENT DOCUMENTS

| | | | |
|---|---|---|---|
| 5,357,007 A * | 10/1994 | Wengrovius | C09J 7/38 |
| | | | 528/502 E |
| 5,392,592 A * | 2/1995 | Bozich | B65D 65/42 |
| | | | 206/524.1 |
| 5,466,532 A * | 11/1995 | Wengrovius | C08L 83/00 |
| | | | 428/447 |
| 5,576,110 A * | 11/1996 | Lin | C08L 83/00 |
| | | | 428/447 |
| 5,977,243 A * | 11/1999 | Barthel | C08L 83/04 |
| | | | 524/588 |
| 6,177,506 B1 | 1/2001 | Takahashi et al. | |
| 6,376,569 B1 * | 4/2002 | Oxman | C08K 5/00 |
| | | | 528/25 |
| 6,379,792 B1 | 4/2002 | Isshiki et al. | |
| 6,433,055 B1 | 8/2002 | Kleyer et al. | |
| 8,124,689 B2 | 2/2012 | Loubert et al. | |
| 2002/0132891 A1 | 9/2002 | Azechi et al. | |
| 2004/0265599 A1 | 12/2004 | Ushio et al. | |
| 2006/0057779 A1 | 3/2006 | Sutoh et al. | |
| 2006/0094834 A1 | 5/2006 | Aoki et al. | |
| 2006/0270788 A1 | 11/2006 | Ozai et al. | |
| 2008/0319144 A1 | 12/2008 | Morita et al. | |
| 2009/0042043 A1 | 2/2009 | Joseph et al. | |
| 2009/0075009 A1 | 3/2009 | Fujisawa et al. | |
| 2009/0171013 A1 | 7/2009 | Taguchi et al. | |
| 2009/0281222 A1 | 11/2009 | Nishiumi et al. | |
| 2011/0104506 A1 | 5/2011 | Behl et al. | |
| 2011/0236666 A1 | 9/2011 | Hall et al. | |
| 2012/0139131 A1 | 6/2012 | Sugo et al. | |
| 2013/0183776 A1 | 7/2013 | Kashiwagi et al. | |
| 2013/0200554 A1 | 8/2013 | Mueller | |
| 2013/0274398 A1 | 10/2013 | Shiobara et al. | |
| 2014/0296468 A1 * | 10/2014 | Kownacka | B01J 31/2291 |
| | | | 556/431 |
| 2014/0377570 A1 | 12/2014 | Hirai et al. | |
| 2015/0115311 A1 | 4/2015 | Yoshida et al. | |
| 2015/0124338 A1 | 5/2015 | Mayumi et al. | |
| 2015/0183960 A1 | 7/2015 | Yamazaki et al. | |
| 2015/0315427 A1 | 11/2015 | Yoshida et al. | |
| 2015/0376482 A1 * | 12/2015 | Bekemeier | B32B 7/12 |
| | | | 428/447 |
| 2016/0230005 A1 | 8/2016 | Mayumi et al. | |
| 2016/0311980 A1 * | 10/2016 | Knoer | A61Q 19/00 |
| 2017/0057980 A1 * | 3/2017 | Boyer | C07F 7/0879 |
| 2017/0058103 A1 | 3/2017 | Fujisawa et al. | |
| 2017/0092822 A1 | 3/2017 | Amako et al. | |
| 2017/0166701 A1 | 6/2017 | Jo et al. | |
| 2017/0283613 A1 | 10/2017 | Mochizuki | |
| 2017/0355804 A1 | 12/2017 | Fujisawa et al. | |
| 2018/0105692 A1 | 4/2018 | Imaizumi et al. | |
| 2018/0208816 A1 | 7/2018 | Yamazaki et al. | |
| 2018/0305547 A1 | 10/2018 | Dogen et al. | |
| 2019/0169398 A1 | 6/2019 | Yamazaki | |
| 2019/0169435 A1 | 6/2019 | Yamazaki | |
| 2019/0177488 A1 | 6/2019 | Yamazaki | |
| 2019/0276684 A1 | 9/2019 | Yamazaki et al. | |
| 2019/0367744 A1 * | 12/2019 | Chevalier | C08L 83/04 |
| 2020/0216671 A1 | 7/2020 | Matsuzaki et al. | |
| 2020/0224069 A1 * | 7/2020 | Itoh | B32B 27/286 |
| 2020/0354615 A1 | 11/2020 | Itoh et al. | |
| 2020/0392335 A1 | 12/2020 | Yamazaki | |
| 2021/0162704 A1 | 6/2021 | Sreeram et al. | |
| 2021/0179783 A1 * | 6/2021 | Yoshitake | G02B 1/04 |
| 2021/0179849 A1 * | 6/2021 | Yoshitake | C08G 77/08 |
| 2021/0189129 A1 | 6/2021 | Yamazaki et al. | |
| 2021/0198489 A1 * | 7/2021 | Yoshitake | C08L 83/04 |
| 2021/0269691 A1 * | 9/2021 | Itoh | C09J 7/38 |
| 2021/0284888 A1 * | 9/2021 | Itoh | C09J 7/38 |
| 2021/0292607 A1 * | 9/2021 | Itoh | C09J 7/38 |
| 2022/0002493 A1 * | 1/2022 | Sugie | H01L 33/56 |
| 2022/0048230 A1 | 2/2022 | Imaizumi et al. | |
| 2022/0064447 A1 | 3/2022 | Yamazaki | |
| 2022/0064491 A1 | 3/2022 | Yamazaki | |
| 2022/0089872 A1 | 3/2022 | Fukui et al. | |
| 2022/0169894 A1 | 6/2022 | Yamazaki et al. | |
| 2022/0186099 A1 | 6/2022 | Yamazaki et al. | |
| 2022/0195269 A1 | 6/2022 | Yamazaki | |
| 2022/0340756 A1 | 10/2022 | Nishijima et al. | |
| 2022/0403114 A1 * | 12/2022 | Sugie | C08F 220/306 |
| 2023/0044439 A1 | 2/2023 | Yamamoto et al. | |
| 2023/0137947 A1 | 5/2023 | Yamazaki et al. | |
| 2023/0151215 A1 * | 5/2023 | Yamazaki | B29C 48/40 |
| | | | 428/220 |
| 2024/0002605 A1 | 1/2024 | Tanaka et al. | |
| 2024/0052106 A1 * | 2/2024 | Yamazaki | C08G 77/12 |
| 2024/0052220 A1 | 2/2024 | Yamamoto et al. | |

FOREIGN PATENT DOCUMENTS

| | | |
|---|---|---|
| CN | 103849149 A | 6/2014 |
| CN | 104870585 A | 8/2015 |
| CN | 106459419 A | 2/2017 |
| CN | 106715593 A | 5/2017 |
| CN | 107429062 A | 12/2017 |
| CN | 108026373 A | 5/2018 |
| CN | 109844029 A | 6/2019 |
| EP | 1002834 A1 | 5/2000 |
| EP | 3954739 A1 | 2/2022 |
| EP | 4083140 A1 | 11/2022 |
| EP | 4130157 A1 | 2/2023 |
| EP | 4269503 A1 | 11/2023 |
| JP | H0275681 A | 3/1990 |
| JP | H0625602 A | 2/1994 |
| JP | H11158379 A | 6/1999 |
| JP | H11279182 A | 10/1999 |
| JP | H11335572 A | 12/1999 |
| JP | 2000063681 A | 2/2000 |
| JP | 2000198929 A | 7/2000 |
| JP | 2001019933 A | 1/2001 |
| JP | 2002155261 A | 5/2002 |
| JP | 2003176462 A | 6/2003 |
| JP | 2003226812 A | 8/2003 |
| JP | 2004043814 A | 2/2004 |
| JP | 2004307691 A | 11/2004 |
| JP | 2004315571 A | 11/2004 |
| JP | 2005007331 A | 1/2005 |
| JP | 2006188593 A | 7/2006 |
| JP | 2006274007 A | 10/2006 |
| JP | 2007119768 A | 5/2007 |
| JP | 2007231039 A | 9/2007 |
| JP | 2009503133 A | 1/2009 |
| JP | 2009132797 A | 6/2009 |
| JP | 2009155415 A | 7/2009 |
| JP | 2010047646 A | 3/2010 |
| JP | 2010509088 A | 3/2010 |
| JP | 2011525444 A | 9/2011 |
| JP | 2012017427 A | 1/2012 |
| JP | 2013076050 A | 4/2013 |
| JP | 2013523482 A | 6/2013 |
| JP | 2013147546 A | 8/2013 |
| JP | 2013221075 A | 10/2013 |
| JP | 2013221082 A | 10/2013 |
| JP | 2013222761 A | 10/2013 |
| JP | 2013232580 A | 11/2013 |
| JP | 5385247 B2 | 1/2014 |
| JP | 2014009322 A | 1/2014 |
| JP | 2014221915 A | 11/2014 |
| JP | 2015010132 A | 1/2015 |
| JP | 2015110752 A | 6/2015 |
| JP | 2015214637 A | 12/2015 |
| JP | 2016124967 A | 7/2016 |
| JP | 2017512224 A | 5/2017 |
| JP | 2017101137 A | 6/2017 |
| JP | 2017520918 A | 7/2017 |
| JP | 2017226724 A | 12/2017 |
| JP | 2018519369 A | 7/2018 |
| JP | 2018177993 A | 11/2018 |
| JP | 2019167832 A | 10/2019 |
| JP | 2019167833 A | 10/2019 |
| JP | 2021107149 A | 7/2021 |
| JP | 2021108319 A | 7/2021 |
| TW | 201439219 A | 10/2014 |
| WO | 2006104236 A1 | 10/2006 |

(56) References Cited

FOREIGN PATENT DOCUMENTS

| | | | |
|---|---|---|---|
| WO | 2008056810 A1 | 5/2008 |
| WO | 2013051600 A1 | 4/2013 |
| WO | 2014002918 A1 | 1/2014 |
| WO | 2014136805 A1 | 9/2014 |
| WO | 2015056483 A1 | 4/2015 |
| WO | 2015126780 A1 | 8/2015 |
| WO | 2015155949 A1 | 10/2015 |
| WO | 2016038836 A1 | 3/2016 |
| WO | 2016103654 A1 | 6/2016 |
| WO | 2016136243 A1 | 9/2016 |
| WO | 2017068762 A1 | 4/2017 |
| WO | 2018028792 A1 | 2/2018 |
| WO | 2018030286 A1 | 2/2018 |
| WO | 2018030287 A1 | 2/2018 |
| WO | 2018030288 A1 | 2/2018 |
| WO | 2018084012 A1 | 5/2018 |
| WO | 2018186161 A1 | 10/2018 |
| WO | 2018235491 A1 | 12/2018 |
| WO | 2018235492 A1 | 12/2018 |
| WO | 2019059351 A1 | 3/2019 |
| WO | 2019078140 A1 | 4/2019 |
| WO | 2019088067 A1 | 5/2019 |
| WO | 2019208756 A1 | 10/2019 |
| WO | 2020090797 A1 | 5/2020 |
| WO | 2020138055 A1 | 7/2020 |
| WO | 2020138409 A1 | 7/2020 |
| WO | 2020138410 A1 | 7/2020 |
| WO | 2020166692 A1 | 8/2020 |
| WO | 2020203304 A1 | 10/2020 |
| WO | 2020203307 A1 | 10/2020 |
| WO | 2021132710 A1 | 7/2021 |
| WO | 2021200643 A1 | 10/2021 |
| WO | 2022004463 A1 | 1/2022 |
| WO | 2022138336 A1 | 6/2022 |

OTHER PUBLICATIONS

Machine assisted English translation of JP2017101137A obtained from https://patents.google.com/patent on Jul. 21, 2021, 11 pages.
Machine assisted English translation of JP2017226724A obtained from https://patents.google.com/patent on Aug. 14, 2024, 14 pages.
Machine assisted English translation of JP2003226812A obtained from https://patents.google.com/patent on Aug. 14, 2024, 11 pages.
Machine assisted English translation of CN103849149A obtained from https://worldwide.espacenet.com/patent on Jan. 22, 2024, 11 pages.
Machine assisted English translation of JPH11158379A obtained from https://worldwide.espacenet.com/patent on Nov. 9, 2023, 11 pages.
Machine assisted English translation of CN106715593A obtained from https://patents.google.com/patent on Mar. 14, 2023, 26 pages.
Machine assisted English translation of JP2005007331A obtained from https://patents.google.com/patent on Mar. 14, 2023, 15 pages.
Machine assisted English translation of JP2004315571A obtained from https://patents.google.com/patent on Mar. 14, 2023, 15 pages.
Machine assisted English translation of JP2015010132A obtained from https://patents.google.com/patent on Mar. 14, 2023, 22 pages.
Machine assisted English translation of JP2004307691A obtained from https://patents.google.com/patent on Mar. 14, 2023, 11 pages.
Machine assisted English translation of JP2013222761A obtained from https://patents.google.com/patent on Mar. 15, 2023, 20 pages.
Machine assisted English translation of JP2018177993A obtained from https://patents.google.com/patent on Mar. 15, 2023, 36 pages.
International Search Report for PCT/JP2019/051394 dated Mar. 17, 2020, 2 pages.
Machine assisted English translation of WO2018235492A1 obtained from https://patents.google.com/patent on Oct. 4, 2021, 20 pages.
Machine assisted English translation of JP2016124967A obtained from https://patents.google.com/patent on Oct. 4, 2021, 18 pages.
Machine assisted English translation of WO2016038836A1 obtained from https://patents.google.com/patent on Oct. 4, 2021, 18 pages.
Machine assisted English translation of WO2013051600A1 obtained from https://patents.google.com/patent on Oct. 4, 2021, 25 pages.
Machine assisted English translation of JP2007231039A obtained from https://patents.google.com/patent on Oct. 5, 2021, 7 pages.
International Search Report for PCT/JP2019/051393 dated Mar. 17, 2020, 3 pages.
International Search Report for PCT/JP2019/051392 dated Mar. 17, 2020, 2 pages.
International Search Report for PCT/JP2019/051391 dated Mar. 13, 2020, 3 pages.
International Search Report for PCT/JP2020/012028 dated Jun. 9, 2020, 3 pages.
Machine assisted English translation of JP2013221082A obtained from https://patents.google.com/patent on Oct. 27, 2021, 14 pages.
Machine assisted English translation of WO2020138410A1 obtained from https://patents.google.com/patent on Oct. 27, 2021, 19 pages.
Machine assisted English translation of WO2020138409A1 obtained from https://patents.google.com/patent on Aug. 15, 2024, 22 pages.
Machine assisted English translation of JP11335572A obtained from https://patents.google.com/patent on Oct. 27, 2021, 7 pages.
Machine assisted English translation of JPH11279182A obtained from https://patents.google.com/patent on Oct. 27, 2021, 8 pages.
Machine assisted English translation of JP2003176462A obtained from https://patents.google.com/patent on Oct. 27, 2021, 11 pages.
Machine assisted English translation of JP2009132797A obtained from https://patents.google.com/patent on Oct. 27, 2021, 9 pages.
Machine assisted English translation of JP2012017427A obtained from https://patents.google. com/patent on Oct. 27, 2021, 13 pages.
Machine assisted English translation of JP2000063681A obtained from https://patents.google.com/patent on Oct. 28, 2021, 8 pages.
International Search Report for PCT/JP2020/012027 dated Jun. 9, 2020, 3 pages.
International Search Report for PCT/JP2020/012030 dated Jun. 9, 2020, 2 pages.
International Search Report for PCT/JP2020/012029 dated Jun. 9, 2020, 3 pages.
International Search Report (with English translation) for PCT/JP2020/049074 dated Mar. 23, 2021, 7 pages.
Machine assisted English translation of JPH0625602 obtained from https://patents.google.com/patent on Nov. 11, 2022, 6 pages.
Machine assisted English translation of JP2019167832 obtained from https://patents.google.com/patent on Nov. 11, 2022, 11 pages.
Machine assisted English translation of JP2019167833 obtained from https://patents.google.com/patent on Nov. 11, 2022, 9 pages.
International Search Report (with English translation) for PCT/JP2021/012840 dated Jun. 15, 2021, 6 pages.
English translation of International Search Report for PCT/JP2022/046146 dated Jan. 31, 2023, 2 pages.
Machine assisted English translation of JP2017101137A obtained from https://worldwide.espacenet.com/patent on Apr. 7, 2024, 18 pages.
Machine assisted English translation of JP2021108319A obtained from https://worldwide.espacenet.com/patent on Mar. 12, 2024, 73 pages.
Machine assisted English translation of WO2020138055A1 obtained from https://worldwide.espacenet.com/patent on Apr. 7, 2024, 43 pages.
English translation of International Search Report for PCT/JP2021/046092 dated Feb. 8, 2022, 2 pages.
English translation of International Search Report for PCT/JP2021/046093 dated Mar. 15, 2022, 2 pages.
Dowsiltm EA-4600 Silicone Adhesive Application Guide for PCT Device Assemblies (Dow Toray Co., Ltd. publication, Form No. 1-3497-42-1120 S2D, 2020).
Machine assisted English translation of WO2019208756A1 obtained from https://worldwide.espacenet.com/patent on Dec. 21, 2023, 32 pages.
Machine assisted English translation of JP2014221915A obtained from <https://patents.google.com/patent> on Nov. 20, 2024, 17 pages.

* cited by examiner

[FIG. 1]
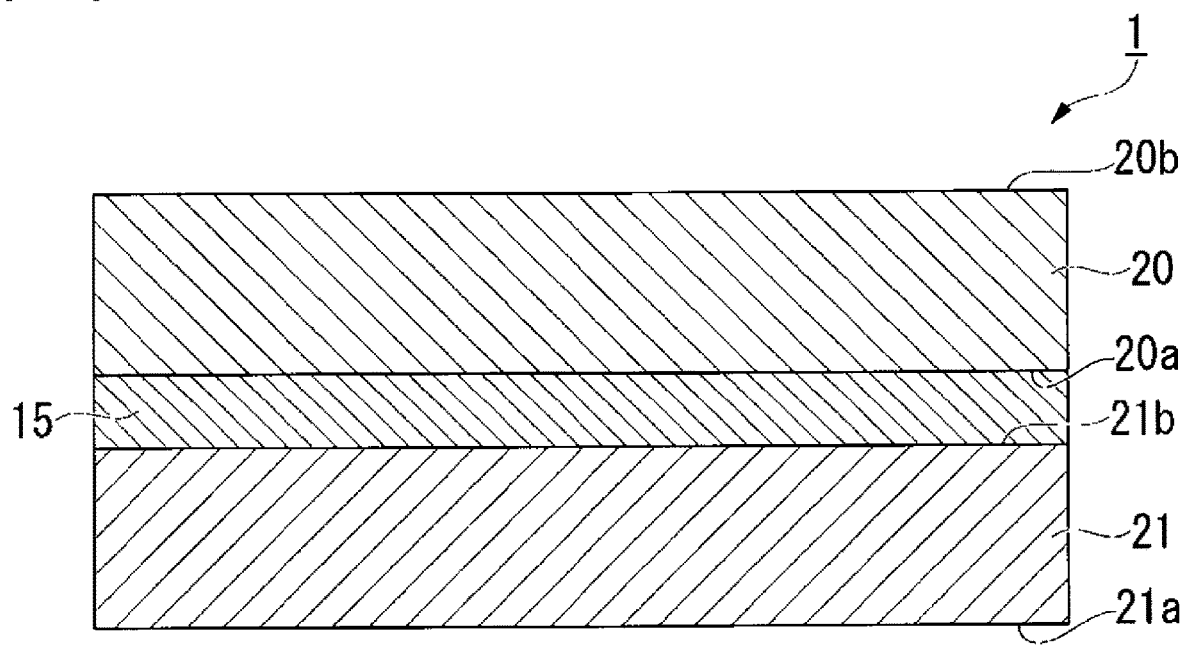
[FIG. 2]
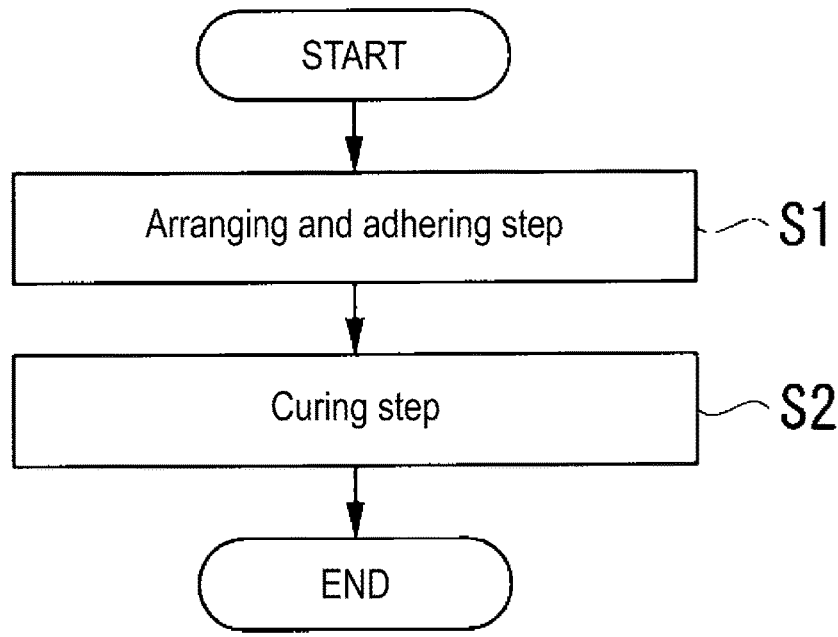

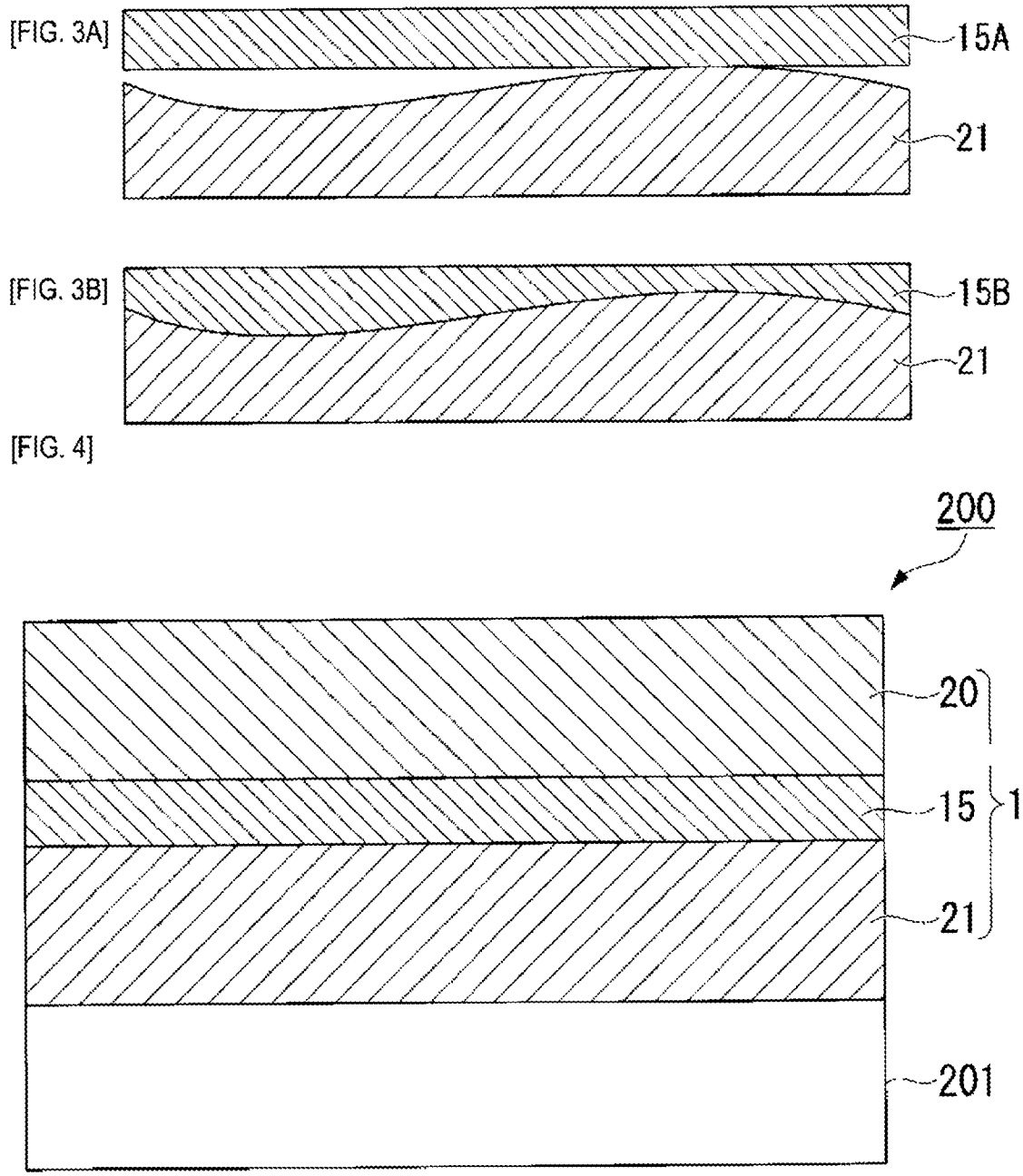

[FIG. 5]
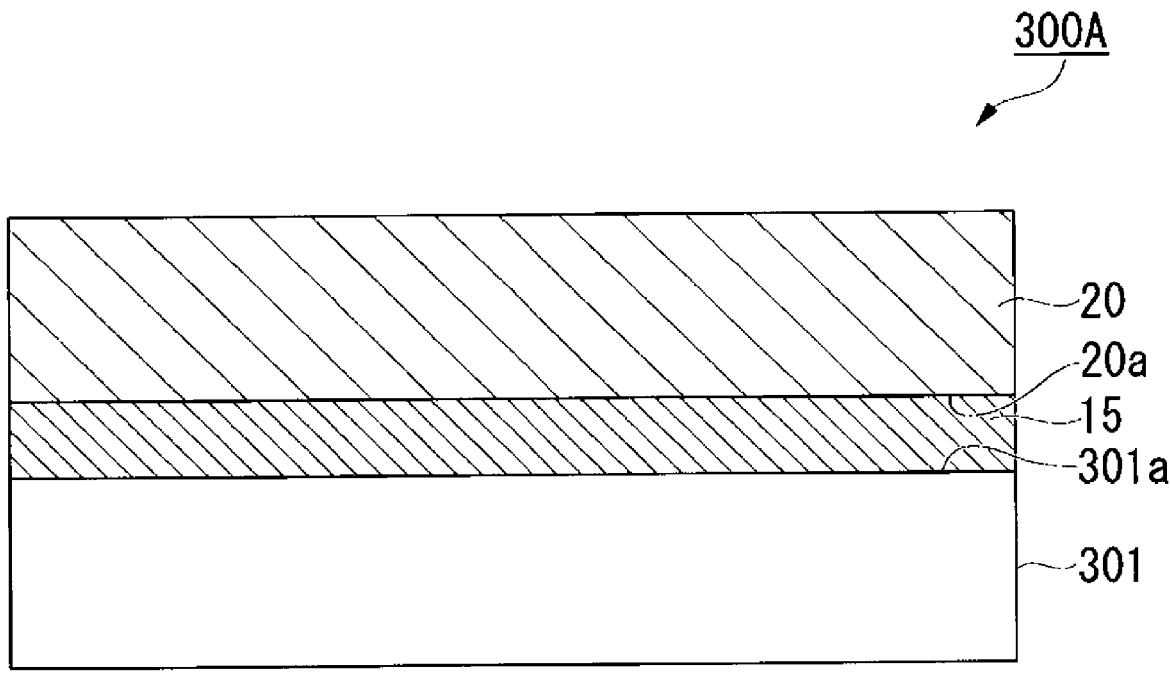
[FIG. 6]
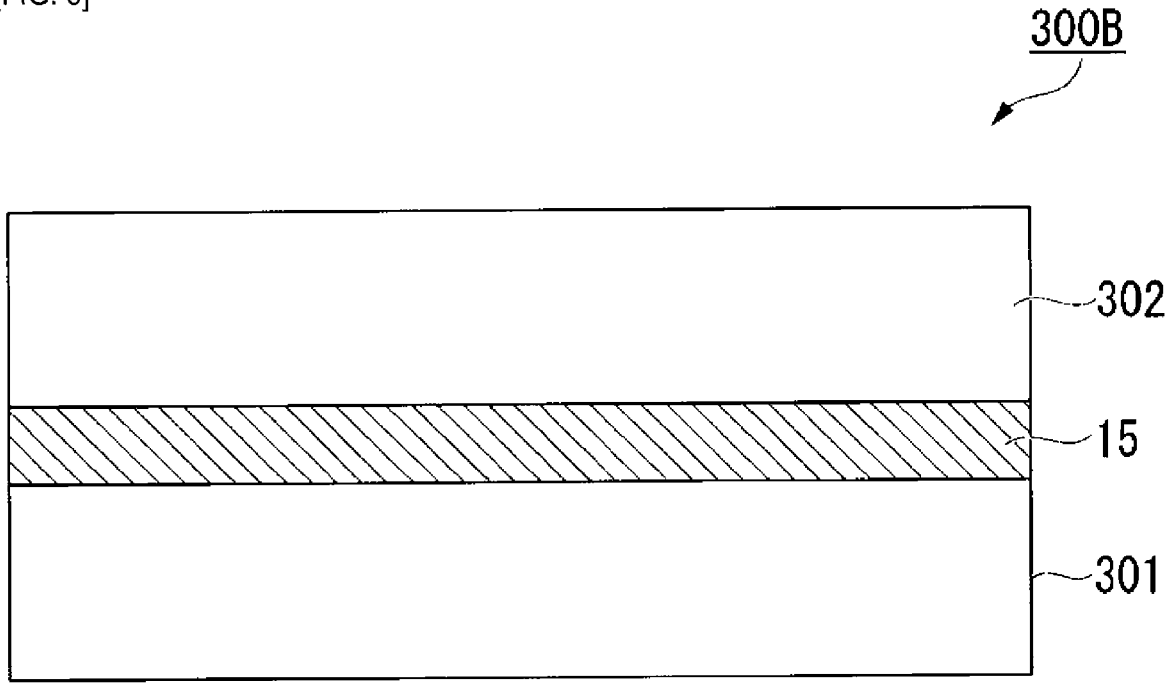

[FIG. 7]
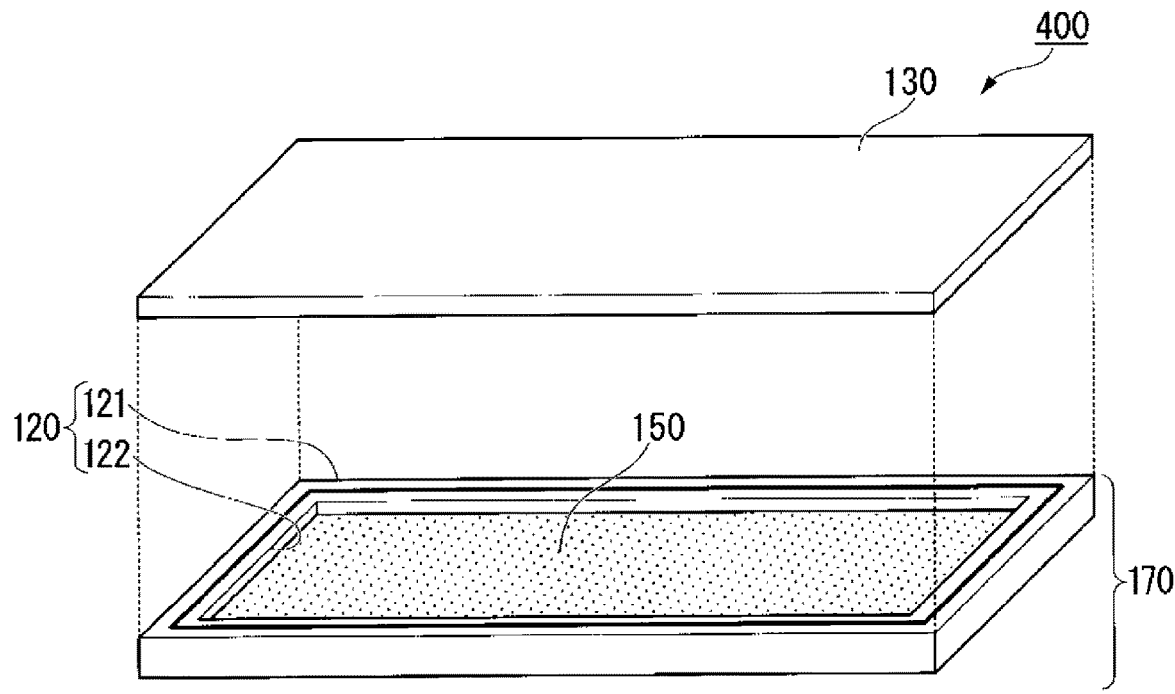
[FIG. 8]
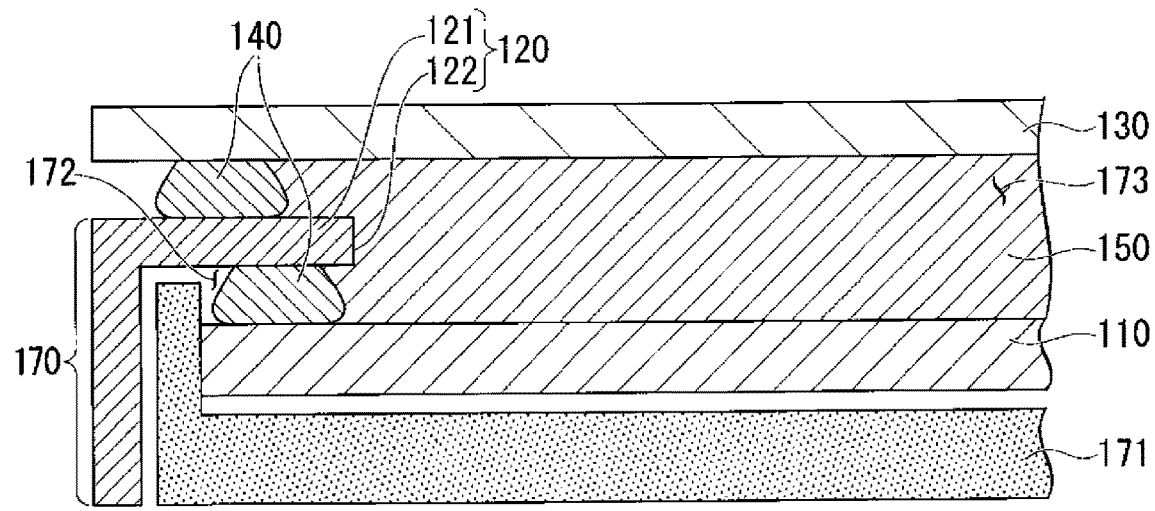

[FIG. 9]
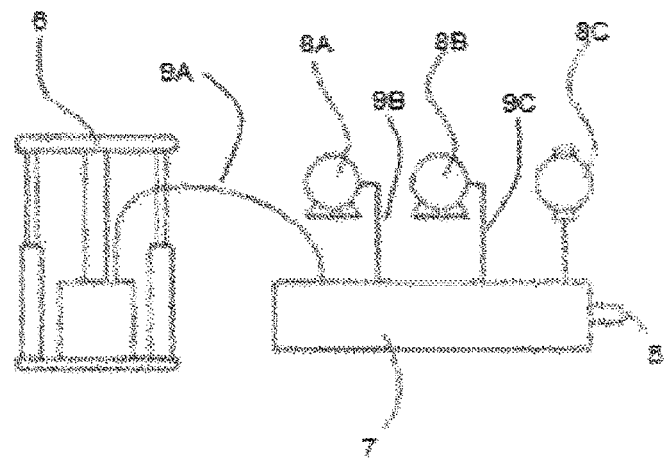
[FIG. 10]
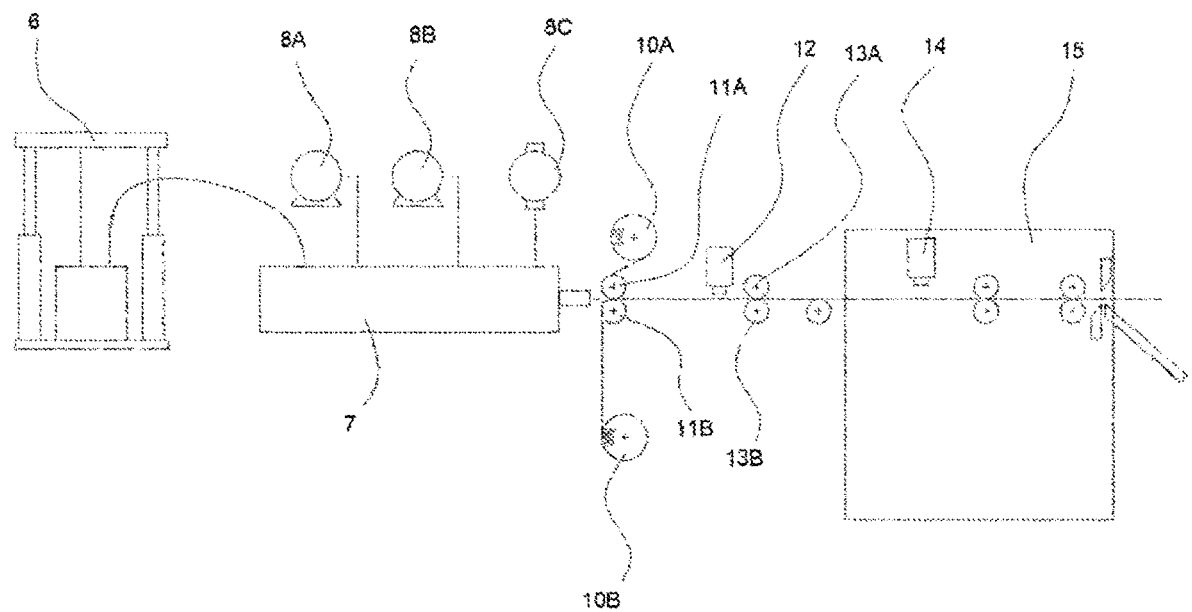

CURABLE REACTIVE SILICONE COMPOSITION, CURED PRODUCT THEREOF AND USES OF COMPOSITION AND CURED PRODUCT

CROSS-REFERENCE TO RELATED APPLICATIONS

This application is the National Stage of International Appl. No. PCT/JP2019/042320 filed on 29 Oct. 2019, which claims priority to and all advantages of Japanese Appl. No. 2018-203771 filed on 30 Oct. 2018, and Japanese Appl. No. 2019-054633 filed on 22 Mar. 2019, the contents of which are hereby incorporated by reference.

TECHNICAL FIELD

The present invention relates to a curing reactive silicone composition, cured product thereof, and an application such as a heat meltable pressure sensitive adhesive material containing the composition, a laminate body containing the composition or a cured product thereof, and the like. Furthermore, the present invention also relates to a method of manufacturing the laminate body. Furthermore, the present invention also relates to a method of manufacturing a sheet containing a curing reactive silicone composition.

BACKGROUND ART

Silicone materials are used in a variety of applications due to having excellent performance with heat resistance, chemical resistance, electrical insulation, and the like. Silicone materials can be formed on a variety of substrates, such as plastics, metals, glass, ceramics, paper, wood, and the like, and have a wide range of applications, such as daily necessities, medical products, electronic products, and the like. For example, a silicone material formed on a substrate is used as a pressure sensitive adhesive material. Specifically, in addition to use as industrial protection tape, masking tape and the like, as well as an adhesive for tapes with various types of functionality for medical use, they are used as an optical member for displays (used after adhering a displaying device, functional film, lens, or the like, and then incorporating into a device as is).

Silicone materials are usually obtained by crosslinking an organopolysiloxane by a hydrosilylation reaction. A transition metal complex catalyst, which is usually activated by heat, is used in the hydrosilylation reaction from the perspective of workability and the like. However, in the aforementioned applications, when silicone materials are formed on a substrate such as a thermoplastic resin film or the like, a catalyst that is activated by irradiating with a high energy beam such as ultraviolet rays or the like is used because the substrate cannot be heated to a high temperature.

Patent Document 1 describes a silicone base pressure sensitive adhesive composition having a high solid fraction concentration including such a high energy beam activation catalyst, but the composition has a problem where adhesion to an adherend is low in an uncured state.

On the other hand, Patent Document 2 describes a composition containing a straight chain organopolysiloxane and a branched organopolysiloxane that be cured by a light activated catalyst, but the composition has a problem where adhesion to an adherend is low in a cured state.

PRIOR ART DOCUMENTS

Patent Documents

Patent Document 1: Japanese Unexamined Patent Application H2-75681
Patent Document 2: Japanese Unexamined Patent Application 2017-101137

SUMMARY OF THE INVENTION

Problems to be Solved by the Invention

An object of the present invention is to provide: a curing reactive silicone composition having sufficient toughness and sufficient pressure sensitive adhesive strength to temporarily secure various substrates even in an uncured state, having heat meltability and excellent moldability of a sheet or the like, and that can be quickly cured by high energy irradiation to achieve high adhesive strength; and a cured product thereof that can achieve high adhesive strength by crimping. Further, an object of the present invention is to provide a pressure sensitive adhesive material which is an application of the curing reactive silicone composition and the cured product thereof. Similarly, an object of the present invention is to provide: a laminate body provided with a layer containing the curing reactive silicone composition or the cured product thereof; and a method of manufacturing the laminate body. Furthermore, an object of the present invention is to provide a method of manufacturing a sheet containing a curing reactive silicone composition.

Means for Solving the Problems

An object of the present invention can be achieved by a curing reactive silicone composition, containing:
(A) an organopolysiloxane resin containing in a molecule a siloxane unit (M unit) as expressed by $R_3SiO_{1/2}$ (where R mutually independently represent a monovalent organic group) and a siloxane unit (Q unit) as expressed by $SiO_{4/2}$;
(B) a straight chain or branched organopolysiloxane having at least two groups containing an aliphatic unsaturated carbon-carbon bond in one molecule and a degree of siloxane polymerization within a range of 80 to 3000;
(C) an organohydrogenpolysiloxane having at least two silicon-bonded hydrogen atoms in one molecule; and
(D) a hydrosilylation reaction catalyst that does not exhibit activity without irradiating with a high energy beam, but exhibits activity in a composition by irradiating a high energy beam; where the amount of component (A) is more than 55 mass % to less than 90 mass % of the total mass of component (A) to component (C),
the amount of component (C) is an amount such that the silicon-bonded hydrogen atoms in component (C) is 0.5 mols or more relative to one mol the total aliphatic unsaturated carbon-carbon bonds in the composition,
the composition is non-fluid at 25° C., and
heat meltability is provided.

At least a portion of component (A) is preferably a curing reactive organopolysiloxane resin containing in a molecule at least a siloxane unit (M unit) as expressed by (Alk)$R'_2SiO_{1/2}$ (where Alk mutually independently represent a group containing an aliphatic unsaturated carbon-carbon bond, and R' mutually independently represent a group not containing an aliphatic unsaturated carbon-carbon bond) and a siloxane unit (Q unit) as expressed by $SiO_{4/2}$. Note that the group containing an aliphatic unsaturated carbon-carbon bond is preferably an alkenyl group, an alkenyloxyalkyl group, an acryloxyalkyl group, or a methacryloxyalkyl group.

Component (A) is preferably an organopolysiloxane resin as expressed by general unit formula: $(R_3SiO_{1/2})_a(SiO_{4/2})_b$ (where R mutually independently represents a monovalent organic group, a and b are positive numbers, respectively, and a+b=1 and a/b=0.5 to 1.5).

The degree of siloxane polymerization of component (B) is more preferably 100 to 2000.

At least a portion of component (C) is preferably at least one type selected from:
 (c1) an organohydrogenpolysiloxane having at least three silicon-bonded hydrogen atoms in a molecule; and
 (c2) a straight chain organohydrogenpolysiloxane having a silicon-bonded hydrogen atom on an end of a molecular chain.

The curing reactive silicone composition of the present invention (hereinafter, may simply be referred to as "composition of the present invention") is heat meltable and particularly preferably has a melt viscosity at 100° C. of 100,000 Pa·s or less.

The composition of the present invention preferably has properties as a pressure sensitive adhesive material. Specifically, in a state before a curing reaction, a test piece in which a curable layer with a thickness of 200 μm containing a curing reactive silicone composition is formed between two glass plates is preferably used, and the shear adhesive strength of the curable layer is preferably 0.1 MPa or more, as measured by a method specified in JIS K 6850.

The present invention also relates to a member, a component, or a sheet at least containing the curing reactive silicone composition.

Similarly, the present invention also relates to a heat meltable pressure sensitive adhesive material containing the curable silicone composition. In other words, the curable silicone composition can be used as a heat meltable pressure sensitive adhesive material.

The present invention also relates to a cured product of the curable silicone composition.

The cured product is preferably cured by irradiating with a high energy beam.

The cured product of the present invention also preferably has properties as a pressure sensitive adhesive material. Specifically, a cured product layer with a thickness of 200 μm containing the curing reactive silicone composition is preferably formed between two glass plates, and the shear adhesive strength of the cured product layer is preferably 0.4 MPa or more, as measured by a method specified in JIS K 6850.

Similarly, the present invention also relates to a pressure sensitive adhesive material containing a cured product of the curing reactive silicone composition. In other words, the cured product of the curable silicone composition can be used as a pressure sensitive adhesive material.

The present invention also relates to a member, a component, or a sheet containing at least the pressure sensitive adhesive.

In addition thereto, the present invention also relates to a laminate body containing a layer or member containing the curing reactive silicone composition. Furthermore, the present invention also relates to a laminate body containing a layer or member containing a cured product of the curing reactive silicone.

These laminate bodies may contain a sheet-like member provided with a release layer in at least a portion, and, for example, may be a releasable laminate body where a member, a component, or a part at least containing the composition or a cured product thereof is arranged to as to face a sheet-like member provided with a release layer, and peeled from the release layer at the time of use, and where the composition or a cured product thereof is used as a pressure sensitive adhesive material.

The laminate body may be at least one type selected from displaying devices, electronic components, or solar cell modules, and may be, for example, a displaying device such as a liquid crystal display or an organic EL display. Furthermore, the curing reactive silicone composition or a cured product thereof may be used as a sealing material for electronic components such as LEDs, micro LEDs, and the like.

Preferably, the laminate body of the present invention can be used in various articles with at least one substrate. For example, the substrate may be an image display panel, a touch panel, an optical film, or a surface or rear surface protective sheet. In this case, the article is preferably a displaying device (display). Furthermore, the displaying device is more preferably a liquid crystal display or an organic EL display. Furthermore, the substrate may be a solar cell, a sealing material layer, or a front surface or back surface protective sheet. In this case, the article is preferably a solar cell module.

The present invention also relates to methods of manufacturing these laminate bodies. The laminate bodies obtained by these manufacturing methods may be a releasable pressure sensitive adhesive material sheet or other intermediate material, or a displaying device provided with a pressure sensitive adhesive material layer or other final product or precursor thereof.

The method of manufacturing a laminate body of the present invention may include a step of melting the curing reactive silicone composition by heating at 80° C. or higher and then molding or filling the molten product.

The manufacturing method of the laminate body of the present invention may include a step of arranging the curing reactive silicone composition on at least one member or between members and then simultaneously irradiating the curing reactive silicone composition with a high energy beam. Note that irradiation of the high energy beam is preferably performed via a transparent portion or a gap or other transmitting part that can transmit the high energy beam.

The manufacturing method of the laminate body of the present invention may include: a step of laminating the curing reactive silicone composition or a cured product thereof interposed between members; and a step crimping the members by the curing reactive silicone composition or cured product thereof.

Furthermore, a sheet at least containing the curing reactive silicone composition may be obtained by a method of manufacturing a sheet, including the following steps:
 Step 1: a step of removing an organic solvent from a solution, in which the organopolysiloxane resin of component (A) and a portion or all of a straight chain or branched diorganopolysiloxane of component (B) are dissolved in the organic solvent, at a temperature of 150° C. or higher to obtain a hot melt solid fraction;
 Step 2: a step of adding the organohydrogenpolysiloxane of component (C) and the hydrosilylation reaction catalyst of the component (D) to the hot melt solid fraction obtained in step 1, and then kneading while heating and melting at a temperature of 120° C. or lower;

Step 3: a step of laminating the mixture after heating and melting obtained in step 2 between sheet substrates provided with at least one release surface; and Step 4: a step of stretching the laminate body obtained in step 3 between rollers to mold a sheet containing a curing reactive silicone composition having a specific film thickness.

Effects of the Invention

The curing reactive silicone composition of the present invention has sufficient toughness and sufficient pressure sensitive adhesive strength to temporarily secure various substrates, has heat meltability and excellent moldability of a sheet or the like, and can be quickly cured by irradiating with a high energy beam to achieve high adhesive strength. Furthermore, the curing reactive silicone composition of the present invention can be easily molded into a sheet or other form. Furthermore, a surface of the curing reactive silicone composition of the present invention or cured product thereof have pressure sensitive adhesion, and therefore, high adhesion can be achieved by crimping the cured product onto various substrates. Furthermore, if the cured product is in a form of a layer, and when a cured product layer is released, the cured product layer is interfacially released, and a composition can be designed where cohesive failure of the cured product layer is less likely to occur.

The curing reactive silicone composition of the present invention has heat meltability and therefore can be softened or fluidized by heating. In a molten state, the composition can favorably follow recesses and protrusions on a member to fill a step, and thus has excellent gap fillability. Furthermore, when the curing reactive silicone composition of the present invention is cooled to form a solid layer containing the curing reactive silicone composition which is non-fluid at a low temperature (less than 80° C.), or when a cured product layer is formed, which is non-fluid and not heat meltable is obtained by irradiating a molten product with a high energy beam such as ultraviolet rays or the like to cause a curing reaction, both of these have an advantage of achieving a pressure sensitive adhesive material layer having a high degree of followability to recesses and protrusions on a member. In addition thereto, the curing reactive silicone composition of the present invention is heat meltable, and therefore, a fluid in a molten state can be molded into a desired shape such as a sheet or the like. A molded product such as a sheet or the like containing a curing reactive silicone composition, before the curing reaction itself, has heat meltable, pressure sensitive adhesive strength, and curable reactivity. Therefore a fluid product thereof may be caused to flow into recesses and protrusions of a substrate by arranging at a desired position using pressure sensitive adhesive strength and then heating and melting.

The curing reactive silicone composition of the present invention is, if necessary, irradiated with a high energy beam such as ultraviolet rays or the like such that a curing reaction proceeds to form a cured product layer, and the cured product layer has sufficient pressure sensitive adhesive strength to secure between members. Moreover, after the curing reaction, a non-heat meltable cured product layer is formed and thus can be used as a pressure sensitive adhesive material layer between members.

Furthermore, the curing reactive silicone composition of the present invention utilizes a hydrosilylation reaction catalyst that exhibits activity in the composition by irradiating with a high energy beam such as ultraviolet rays or the like. Therefore, the composition has an advantage where once the curing reaction is initiated by irradiating with a high energy beam, the curing reaction proceeds over time at a low temperature (less than 80° C., and particularly including 23 to 25° C.) even if the irradiation by the high energy beam is stopped due to process necessity such as sealing of a member or the like, to form a cured product serving as a pressure sensitive adhesive material.

The curing reactive silicone composition of the present invention and a cured product thereof have the advantages described above and therefore can be used as a pressure sensitive adhesive material. Furthermore, it is possible to provide a laminate body provided with a layer containing the curing reactive silicone composition of the present invention and a cured product thereof as well a method of manufacturing the laminate body.

Furthermore, it is possible to provide a sheet at least containing the curing reactive silicone composition of the present invention by the method of manufacturing a sheet of the present invention.

BRIEF DESCRIPTION OF THE DRAWINGS

FIG. 1 is a cross sectional view illustrating a laminate body of an embodiment of the present invention.

FIG. 2 is a flowchart showing a method of manufacturing the laminate body of the embodiment of the present invention.

FIG. 3 is a conceptual diagram of a method of manufacturing a laminate body, including a heating and melting step.

FIG. 4 is a cross sectional view illustrating an optical display of an embodiment of the present invention.

FIG. 5 is a cross sectional view illustrating an optical display of an embodiment of the present invention.

FIG. 6 is a cross sectional view illustrating an optical display of another embodiment of the present invention.

FIG. 7 is an exploded perspective view illustrating an optical display of another embodiment of the present invention.

FIG. 8 is a partial cross sectional view illustrating an optical display of another embodiment of the present invention.

FIG. 9 is a diagram expressing a partial configuration of a sheet manufacturing device according to Example 10 (up to an extruder)

FIG. 10 is a diagram expressing the entire configuration of the sheet manufacturing device according to Example 10.

MODE FOR CARRYING OUT THE INVENTION

As a result of extensive studies, the present inventors discovered that a curing reactive composition, in which a so-called MQ resin, a predetermined straight chain or branched organopolysiloxane, a predetermined organohydrogenpolysiloxane, and a high energy beam activation catalyst are combined in a predetermined manner, is non-fluid at 25° C. and heat meltable in an uncured state. Therefore, a cured product can be formed in which gap fillability and moldability are excellent, pressure sensitive adhesive strength for temporarily securing between members is sufficient, a curing reaction proceeds by irradiating with a high energy beam such as ultraviolet rays or the like, and pressure sensitive adhesion with regard to an adherend is excellent, thereby completing the present invention. Herein, as the straight chain or chain or branched organopolysiloxane described above, a straight chain or branched organopolysiloxane having at least two groups containing an aliphatic unsaturated carbon-carbon bond in one molecule, and having a degree of siloxane polymerization within a range of 80 to 3000 can be used to preferably solve the problems of the present invention. Moreover, a pressure sensitive adhesive material layer can be formed, for which a design is possible where high adhesive strength is provided and cohesive failure from an adherend during releasing is less likely to occur.

Various aspects of the present invention will be further described in detail below.

First, a composition of the present invention will be described. Note that in the present specification, "mass %" is synonymous with "weight %", and the basis thereof is the total mass (total weight) of the composition or the like of the present invention, unless otherwise specified.

[Curing Reactive Silicone Composition]

The curing reactive silicone composition of the present invention contains:
- (A) an organopolysiloxane resin containing in a molecule a siloxane unit (M unit) as expressed by $R_3SiO_{1/2}$ (where R mutually independently represent a monovalent organic group) and a siloxane unit (Q unit) as expressed by $SiO_{4/2}$;
- (B) a straight chain or branched organopolysiloxane having at least two groups containing an aliphatic unsaturated carbon-carbon bond in one molecule and a degree of siloxane polymerization within a range of 80 to 3000;
- (C) an organohydrogenpolysiloxane having at least two silicon-bonded hydrogen atoms in one molecule; and
- (D) a hydrosilylation reaction catalyst that does not exhibit activity without irradiating with a high energy beam, but exhibits activity in a composition by irradiating a high energy beam; where the amount of component (A) is more than 55 mass % to less than 90 mass % of the total mass of component (A) to component (C),
the amount of component (C) is an amount such that the silicon-bonded hydrogen atoms in component (C) is 0.5 mols or more relative to one mol the total aliphatic unsaturated carbon-carbon bonds in the composition,
the composition is non-fluid at 25° C., and
heat meltability is provided.

[Properties of Composition at 25° C. and Heat Meltability]

The curing reactive silicone composition of the present invention is non-fluid at 25° C. Non-fluid means that there is no flowing in a no-load condition and, for example, indicates a state of being lower than a softening point as measured by a softening point testing method in accordance with a ring and ball method of hot melt adhesives specified in "Testing Methods for the Softening Point of Hot Melt Adhesives" in JIS K 6863-1994. In other words, in order to be non-fluid at 25° C., the softening point must be higher than 25° C. This is because if it is fluid at 25° C., shape retention at the temperature is favorable. Herein, in addition to shape retention, the composition of the present invention must have sufficient toughness. If this is insufficient, an uncured product tends to be brittle and has difficulty retaining shape, and an expected effect as a pressure sensitive adhesive such as the ability to temporarily secure and the like may not be achieved.

Furthermore, the curable composition of the present invention must have heat meltability. Thereby, processing into a variety of shapes is easy, and favorably following recesses and protrusions on a member is possible in the molten state to fill a step. Thus, gap fillability is excellent. On the other hand, if melt viscosity is too high, moldability into a sheet or the like and the processability into various shapes may deteriorate, and thus gap fillability may also be insufficient. From the perspective of workability during processing and molding, the melt viscosity is preferably less than 100,000 Pa·s at 100° C., more preferably within a range of 10 to 100,000 Pa·s, even more preferably within a range of 10 to 50,000 Pa·s, and yet even more preferably within a range of 100 to 10,000 Pa·s. Furthermore, in the present invention, when component (B) described later is used, a composition having a relatively low melt viscosity at 100° C. can be designed. For example, it is possible to design a curing reactive silicone composition having a melt viscosity at 100° C. within a range of 10 to 10,000 Pa·s, within a range of 100 to 5,000 Pa·s, within a range of 100 to 3,000 Pa·s, within a range of 100 to 1,000 Pa·s, or 1,000 Pa·s or less. Note that these curing reactive silicone compositions exhibit lower melt viscosities at high temperatures above 100° C., not to mention sufficiently exhibiting low softening points below these melt viscosities.

The curing reactive silicone composition of the present invention having the aforementioned properties has heat meltability (so-called hot melt properties) and can be softened or fluidized by heating. The softening or fluidizing temperature is preferably 60 to 120° C., more preferably 65 to 110° C., and even more preferably 80 to 105° C. The curing reactive silicone composition of the present invention is preferably provided with a property of significantly softening or fluidizing, particularly when heated to 80° C. or higher.

[Component (A)]

Component (A) is one of primary components of the curing reactive silicone composition of the present invention. Component (A) may be a single organopolysiloxane resin or a mixture of two or more organopolysiloxane resins.

Component (A) is a component that provides heat meltability (hot melt properties) or pressure sensitive adhesion to the curing reactive silicone composition of the present invention, or provides pressure sensitive adhesion to a cured product thereof, and can provide high adhesion to various bases or substrates. Component (A) is an organopolysiloxane resin containing in a molecule (a) a siloxane unit (M unit) as expressed by $R_3SiO_{1/2}$ (where R mutually independently represent a monovalent organic group) and (b) a siloxane unit (Q unit) as expressed by $SiO_{4/2}$.

The provision of heat meltability (hot melt properties) to the curing reactive silicone composition of the present invention described above means that the organopolysiloxane resin of component (A) mixes and melts well with the organopolysiloxane of component (B), and as a result, the softening point of the mixture is increased to a temperature sufficient to exhibit heat meltability (hot melt properties) at 25° C. (room temperature) or higher, such as 50° C. or higher. Therefore, the softening point of the component (A) is preferably higher than the temperature in an industrial production process.

The molar ratio of M units (a) to Q units (b) is preferably within a range of M units:Q units=0.50:1.00 to 1.50:1.00, more preferably within a range of 0.55:1.00 to 1.20:1.00, and even more preferably within a range of 0.60:1.00 to 1.10:1.00. The molar ratio can be easily measured by 29Si nuclear magnetic resonance.

Component (A) is preferably an organopolysiloxane resin as expressed by general unit formula: $(R_3SiO_{1/2})_a(SiO_{4/2})_b$ (where R mutually independently represents a monovalent organic group, a and b are positive numbers, respectively, and a+b=1 and a/b=0.5 to 1.5).

The component (A) may be configured from only M units (a) and Q units (b), but may also contain $R_2SiO_{2/2}$ units (D units) and/or $RSiO_{3/2}$ units (T units). In the formula, R mutually independently represents a monovalent organic group. The total amount of M units (a) and Q units (b) in component (A) is preferably 50 wt. % or more, more preferably 80 wt. % or more, and particularly preferably 100 wt. %.

The monovalent organic group is not particularly limited, but can be divided into, for example, a group containing an aliphatic unsaturated carbon-carbon bond and a group not containing an aliphatic unsaturated carbon-carbon bond.

The group containing an aliphatic unsaturated carbon-carbon bond and the group not containing an aliphatic unsaturated carbon-carbon bond contain a monovalent unsaturated hydrocarbon group and monovalent unsaturated hydrocarbon group containing an oxygen atom and a monovalent saturated hydrocarbon group and monovalent saturated hydrocarbon group containing an oxygen atom, respectively.

Monovalent unsaturated or saturated hydrocarbon groups include, for example, substituted or unsubstituted monovalent unsaturated hydrocarbon groups having 2 to 12 carbon atoms, preferably 2 to 8 carbons, and more preferably 2 to 6 carbons, and substituted or unsubstituted monovalent saturated hydrocarbon groups having 1 to 12 carbon atoms.

Examples of unsubstituted monovalent unsaturated hydrocarbon groups having 2 to 12 carbon atoms, preferably 2 to 8 carbon atoms, and more preferably 2 to 6 carbon atoms include vinyl groups, allyl groups, propenyl groups, butenyl groups, pentenyl groups, hexenyl groups, and other alkenyl groups. Examples of substituted monovalent unsaturated hydrocarbon groups having 2 to 12 carbon atoms, preferably having 2 to 8 carbon atoms, more preferably having 2 to 6 carbon atoms include those in which a portion of hydrogen atoms of the monovalent unsaturated hydrocarbon groups are substituted by a halogen atom (fluorine, chlorine, bromine or iodine) or the like.

Examples of unsubstituted monovalent saturated hydrocarbon groups having 1 to 12 carbon atoms include methyl groups, ethyl groups, propyl groups, pentyl groups, hexyl group, octyl groups, and other alkyl groups; cyclohexyl groups, cycloheptyl groups, and other cycloalkyl groups; phenyl groups, tolyl groups, xylyl groups, and other aryl groups; benzyl groups, α-methylstyril groups, 2-phenylethyl groups, and other aralkyl groups. Examples of substituted monovalent saturated hydrocarbon groups having 1 to 12 carbon atoms include those in which a portion of hydrogen atoms of the monovalent unsaturated hydrocarbon groups are substituted by a halogen atom (fluorine, chlorine, bromine or iodine) or the like. Specific examples include: fluorinated monovalent saturated hydrocarbon groups, such as 3,3,3-trifluoropropyl groups, 4,4,5,5,5-pentafluorobutyl groups, 3,3,4,4,5,5,6,6-nonafluorohexyl groups, and other perfluoroalkyl groups; and chlorinated monovalent saturated hydrocarbon groups, such as 3-chloropropyl groups and other chloroalkyl groups, and dichlorophenyl groups and other chlorophenyl groups.

The monovalent saturated hydrocarbon group is preferably a substituted or unsubstituted alkyl group having 1 to 12 carbon atoms. Methyl groups are preferable as the substituted or unsubstituted alkyl groups having 1 to 12 carbon atoms. The monovalent unsaturated hydrocarbon group is preferably a substituted or unsubstituted alkenyl group having 2 to 12 carbon atoms. Vinyl groups are preferable as the substituted or unsubstituted alkenyl groups having 2 to 12 carbon atoms.

Examples of monovalent unsaturated or saturated hydrocarbon groups containing an oxygen atom include substituted or unsubstituted monovalent unsaturated hydrocarbon groups containing an oxygen atom, having 2 to 12 carbon atoms, and substituted or unsubstituted monovalent saturated hydrocarbon groups containing an oxygen atom, having 1 to 12 carbon atoms.

Examples of substituted or unsubstituted monovalent unsaturated hydrocarbon group containing an oxygen atom, having 2 to 12 carbon atoms include alkenyloxyalkyl groups, acryloxyalkyl groups, methacryloxyalkyl groups, and the like.

Examples of alkenyloxyalkyl groups include allyloxymethyl groups, 3-allyloxypropyl groups, and the like. Examples of acryloxyalkyl groups include acryloxymethyl groups, 3-acryloxypropyl group, and the like. Examples of methacryloxyalkyl groups include methacryloxymethyl groups, 3-methacryloxypropyl groups, and the like.

Examples of substituted or unsubstituted monovalent saturated hydrocarbon group containing an oxygen atom, having 1 to 12 carbon atoms include alkoxy groups having 1 to 12 carbon atoms and the like.

Examples of alkoxy groups having 1 to 12 carbon atoms include methoxy groups, ethoxy groups, propoxy groups, butoxy groups, isopropoxy groups, and the like.

A portion of these groups may be substituted by a halogen atom (fluorine, chlorine, bromine or iodine) or the like.

The organopolysiloxane resin of component (A) may contain a small amount of hydroxyl groups bonded to a silicon atom. The amount of the hydroxyl group is preferably 0.2 mols or less, and more preferably 0.1 mol or less, with regard to 1 mol of all silicon atoms.

Note that when the organopolysiloxane resin of component (A) contains an alkoxy group bonded to a silicon atom, such as a methoxy group, an ethoxy group, or the like, the amount thereof is preferably 0.2 mols or less, and more preferably 0.1 mol or less, with regard to 1 mol of all silicon atoms.

[(A1) Curing Reactive Organopolysiloxane Resin]

In one aspect of the present invention, at least a portion of component (A) is preferably a curing reactive organopolysiloxane resin containing in a molecule at least a siloxane unit (M unit) as expressed by $(Alk)R'_2SiO_{1/2}$ (where Alk mutually independently represent a group containing an aliphatic unsaturated carbon-carbon bond, and R' mutually independently represent a group not containing an aliphatic unsaturated carbon-carbon bond) and a siloxane unit (Q unit) as expressed by $SiO_{4/2}$.

In the aforementioned aspect, the group containing an aliphatic unsaturated carbon-carbon bond, which is Alk, is preferably an alkenyl group, an alkenyloxyalkyl group, an acryloxyalkyl group, or a methacryloxyalkyl group, as previously described. Furthermore, the group not containing an aliphatic unsaturated carbon-carbon bond, which is R', is preferably an alkyl group, an aryl group, or an aralkyl group, as previously described. Furthermore, a portion of these groups may be substituted by a halogen atom or the like. From an industrial perspective, the group containing an aliphatic unsaturated carbon-carbon bond, which is Alk, is preferably a vinyl group, an allyl group, or a hexenyl group, and the group not containing an aliphatic unsaturated carbon-carbon bond, which is R', is preferably a methyl group, a phenyl group, or the like.

In the aforementioned aspect, if component (A) other than the curing reactive organopolysiloxane resin (A1) is present, component (A) is preferably non-curing reactive. In this case, R of the non-curing reactive component (A) is group not containing an aliphatic unsaturated carbon-carbon bond as previously described, and more preferably an alkyl group, an aryl group, or an aralkyl group. Furthermore, a portion of these groups may be substituted by a halogen atom or the like. From an industrial perspective, the group not containing an aliphatic unsaturated carbon-carbon bond, which is R, is preferably a methyl group, a phenyl group, or the like.

Although the ratio of the curing reactive organopolysiloxane resin (A1) in component (A) is not particularly limited, in order to achieve an appropriate hardness as pressure sensitive adhesive material in the composition of the present invention or a cured product thereof, when the total amount of component (A) is 100 mass %, the amount of preferably 50 mass % or less of component (A), more preferably 30 mass % or less, and even more preferably 20 mass % or less. Preferably, the amount of component (A1) in component (A) is within a range of 0 to 20 mass %, and particularly preferably within a range of 0 to 15 mass %, such that the pressure sensitive adhesive material containing the composition of the present invention or a cured product thereof can be provided with moderate hardness and flexibility as an adhesive layer of a displaying device, a solar cell module, or the like.

Examples of such component (A) can include:

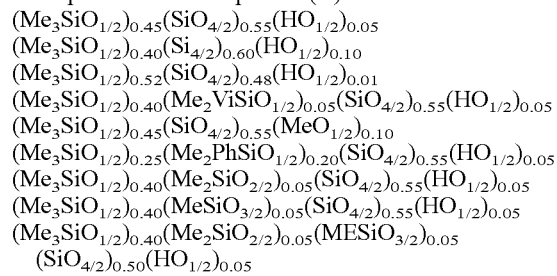

(Me: methyl group, Ph: phenyl group, Vi: vinyl group, MeO: methoxy group, HO: silicon-bonded hydroxyl group.

Note that in order to express the relative amount of hydroxyl groups to silicon atoms, the total amount of the subscripts of units containing a silicon atom is set to 1, and the subscript of the $(HO)_{1/2}$ unit indicates the relative amount).

Component (A) is a component that provides pressure sensitive adhesive strength and heat meltability to the curing reactive silicone composition of the present invention, and therefore, the blending amount of component (A) is within a range of more than 55 mass % to less than 90 mass %, and preferably within a range of 60 to 85 mass %, relative to the sum of the masses of components (A) to (C) of the composition. If the blending amount of component (A) is less than the aforementioned lower limit, the curing reactive silicone composition of the present invention may not have sufficient pressure sensitive adhesive strength, and may not be provided with non-fluidity at 25° C. and heat meltability. On the other hand, if the blending amount of component (A) exceeds the aforementioned upper limit, the curing reactive silicone composition of the present invention becomes too hard and brittle and may be unsuitable for use as a pressure sensitive adhesive material for temporary securing or the like.

[Component (B)]

Component (B) is one of primary components of the curing reactive silicone composition of the present invention. Component (B) may be a single organopolysiloxane or a mixture of two or more organopolysiloxanes.

When component (B) is used, the curing reactive silicone composition of the present invention or a cured product thereof can also form a pressure sensitive adhesive material layer, which has sufficient pressure sensitive adhesive strength and in an adhesive mode thereof, is difficult to cause cohesive failure when released from an adherend. Note that if permanent adhesion with an adherend is required, a composition provided with high adhesive strength that causes cohesive failure of a pressure sensitive adhesive material layer during releasing can be designed.

Component (B) a straight chain or branched organopolysiloxane having at least two groups containing an aliphatic unsaturated carbon-carbon bond in one molecule and has a degree of siloxane polymerization within a range of 80 to 3000. Furthermore, the degree of siloxane polymerization of the organopolysiloxane, which is component (B), is preferably 100 to 2000, more preferably 120 to 1500, and particularly preferably 150 to 1500. If within the range described above, the pressure sensitive adhesive strength of the pressure sensitive adhesive material layer containing the composition or a cured product thereof and adhesive mode to an adherend can be designed as desired while maintaining the heat meltability of the curing reactive silicone composition of the present invention, and in particular, design of a pressure sensitive adhesive material layer in which cohesive failure is less likely to occur when released from an adherend is also easy.

The group containing an aliphatic unsaturated carbon-carbon bond is preferably an alkenyl group, an alkenyloxyalkyl group, an acryloxyalkyl group, or a methacryloxyalkyl group, as previously described. Examples of the alkenyl group includes vinyl groups, allyl groups, propenyl groups, butenyl groups, pentenyl groups, hexenyl groups, and the like. Vinyl groups are particularly preferable. Furthermore, a portion of these groups may be substituted by a halogen atom or the like.

If component (B) is a straight chain, the group containing an aliphatic unsaturated carbon-carbon bond may be present at either an end of a molecular chain, a molecular side chain, or both.

The group containing an aliphatic unsaturated carbon-carbon bond is preferably bonded to a silicon atom.

The amount of the group containing an aliphatic unsaturated carbon-carbon bond is preferably 0.001 to 10 wt. %, more preferably 0.005 to 5 wt. %, and even more preferably 0.01 to 1 wt. %, with regard to the weight of component (B).

Component (B) may have an group not containing an aliphatic unsaturated carbon-carbon bond in addition to a group containing an aliphatic unsaturated carbon-carbon bond. The group not containing an aliphatic unsaturated carbon-carbon bond is preferably an alkyl group, an aryl group, or an aralkyl group, as previously described. Examples of the alkyl group include methyl groups, ethyl groups, propyl groups, pentyl groups, hexyl groups, octyl groups, and the like, as well as cyclohexyl groups, cycloheptyl groups, and other cycloalkyl groups. Examples of aryl groups include phenyl groups, tolyl groups, xylyl groups, and the like. Examples of alkyl groups include benzyl groups, alpha-methylstyril groups, and 2-phenylethyl groups. The group not containing an aliphatic unsaturated carbon-carbon bond is more preferably an alkyl group, and a methyl group is particularly preferable. Furthermore, a portion of these groups may be substituted by a halogen atom or the like.

Component (B) preferably has the following average composition formula (1).

$$R^1_a R^2_b SiO_{(4-a-b)/2} \quad (1)$$

In the average composition formula (1), $R^1$ represents an alkenyl group having 2 to 12 carbons. Specific examples include vinyl groups, allyl groups, butenyl groups, pentenyl groups, hexenyl groups, heptenyl groups, octenyl groups, nonenyl groups, decenyl groups, undecenyl groups, and dodecenyl groups, and of these, a vinyl group, an allyl group, or a hexenyl group is preferable. R2 represents a group selected from monovalent saturated hydrocarbon groups having 1 to 12 carbon atoms and not having an aliphatic unsaturated bond, hydroxyl groups, and alkoxy groups. A portion of the hydrogen atoms of the monovalent saturated hydrocarbon group having 1 to 12 carbon atoms may be substituted with a halogen atom or a hydroxyl group. Examples of monovalent saturated hydrocarbon groups having 1 to 12 carbon atoms include: alkyl groups such as methyl groups, ethyl groups, propyl groups, butyl groups, pentyl groups, hexyl groups, heptyl groups, octyl groups, nonyl groups, decyl groups, undecyl groups, dodecyl groups, and the like; aryl groups such as phenyl groups, tolyl groups, xylyl groups, naphthyl groups, anthracenyl groups, phenanthryl groups, pyrenyl groups, and the like; aralkyl groups such as benzyl groups, phenethyl groups, naphthyl ethyl group, naphthyl propyl groups, anthracenyl ethyl groups, phenanthryl ethyl groups, pyrenyl ethyl groups, and the like; and groups obtained by substituting hydrogen atoms of these aryl groups or aralkyl groups with alkyl groups (such as methyl groups, ethyl groups, and the like), alkoxy groups (such as methoxy groups, ethoxy groups, and the like), or halogen atoms (such as chlorine atoms, bromine atoms, and the like).

a and b represent numbers satisfying the following conditions: 1≤a+b≤3 and 0.0003≤a/(a+b)≤0.33, and are preferably numbers satisfying the following conditions: 1.5≤a+b≤2.5 and 0.0006≤a/(a+b)≤0.2. This is because when a+b is 1 or more, the flexibility of a cured product is increased, while when a+b is 3 or less, the mechanical strength of the cured product is increased. Furthermore, when a/(a+b) is 0.001 or more, the mechanical strength of the cured product is increased, while when 0.33 or less, the flexibility of the cured product is increased.

Such component (B) is preferably straight chain organopolysiloxane as expressed by the general formula:

$$R^6_3SiO(R^6_2SiO)_{m1}SiR^6_3$$

However, component (B) may contain a branched siloxane unit as expressed by $R^6SiO_{3/2}$ or $SiO_{4/2}$ in a portion, and may be a branched organopolysiloxane.

In the formula, each $R^6$ independently represent a substituted or unsubstituted monovalent hydrocarbon group, and examples include the monovalent unsaturated hydrocarbon groups and monovalent saturated hydrocarbon groups described above. However, in one molecule, at least two of the $R^6$ are monovalent unsaturated hydrocarbon groups, preferably alkenyl groups, and more preferably vinyl groups. Furthermore, in the formula, the degree of siloxane polymerization, which is "m1+2", is a number within a range of 80 to 3,000, preferably a number within a range of 100 to 2,000, more preferably a number within a range of 120 to 1,500, and particularly preferably a number within a range of 150 to 1,500. Note that "+2" is a sum of siloxane units at both ends. If the value of m1+2 is less than the aforementioned lower limit, the composition at 25° C. may become liquid, and thus the composition as a whole may not achieve heat meltability (hot-melt properties). Furthermore, if the value of m1+2 is less than the aforementioned lower limit, pressure sensitive adhesion to an adherend is low, and sufficient pressure sensitive adhesive strength may not be achieved in practical use. On the other hand, if m1+2 exceeds the aforementioned upper limit, the adhesive strength after curing may be insufficient.

[Component (C)]

Component (C) is one of the primary components of the curing reactive silicone composition of the present invention and functions as a crosslinking agent. Component (C) may be a single organohydrogenpolysiloxane or a mixture of two or more organohydrogenpolysiloxanes.

Component (C) is an organohydrogenpolysiloxane with at least two silicon-bonded hydrogen atoms in one molecule. Component (C) contains a hydrosilyl group (—SiH) that is added to the aliphatic unsaturated carbon-carbon bond in component (B) or component (A) and component (B) when component (A) has a group containing an aliphatic unsaturated carbon-carbon bond (for example, when component (A1) described above is included).

Specifically, component (C) is an organopolysiloxane having at least two silicon-bonded hydrogen atoms in one molecule. Examples of groups that are bonded to a silicon atom other than silicon-bonded hydrogen atoms in component (C) include: alkyl groups with 1 to 12 carbon atoms such as methyl groups, ethyl groups, propyl groups, butyl groups, pentyl groups, hexyl groups, heptyl groups, octyl groups, nonyl groups, decyl groups, undecyl groups, dodecyl groups, and the like; aryl groups with 6 to 20 carbon atoms such as phenyl groups, tolyl groups, xylyl groups, and the like; aralkyl groups with 7 to 20 carbon atoms such as benzyl groups, phenethyl groups, and the like; and halogen substituted alkyl groups with 1 to 12 carbon atoms such as 3-chloropropyl groups, 3,3,3-trifluoropropyl groups, and the like. Methyl groups and phenyl groups are preferable from the perspective of economic efficiency and heat resistance. Furthermore, the silicon atom in component (C) may be bonded to a small amount of hydroxyl groups or alkoxy groups such as methoxy groups, ethoxy groups, n-propoxy groups, i-propoxy groups, n-butoxy groups, sec-butoxy groups, tert-butoxy groups, and the like so long as an object of the present invention is not impaired.

While the molecular structure of component (C) is not particularly limited, examples thereof include straight chain structures, partially branched straight chain structures, branched structures, cyclic structures, and three-dimensional mesh structures. Component (C) may be a single organopolysiloxane having these molecular structures or a mixture of two or more organopolysiloxanes having these molecular structures.

Although the viscosity of component (C) at 25° C. is not limited, the viscosity is preferably 10,000 mPa·s or less, within a range of 1 to 1,000 mPa·s, or within a range of 5 to 500 mPa·s. This is because if the viscosity of component (C) is above the lower limit of the aforementioned range, an effect on melt viscosity and pressure sensitive adhesive strength of the curable silicone composition (uncured product) is suppressed, while if the viscosity is below the upper limit of the aforementioned range, the transparency and handling workability of an obtained composition are improved.

Component (C) preferably contains the following components (c1) and (c2):

(c1) an organohydrogenpolysiloxane having at least three silicon-bonded hydrogen atoms in a molecule; and (c2) a straight chain organohydrogenpolysiloxane having a silicon-bonded hydrogen atom on an end of a molecular chain.

Component (c1) is an organohydrogenpolysiloxane having three or more silicon-bonded hydrogen atoms in one molecule, which functions as a crosslinking agent in a hydrosilylation reaction with component (B)/component (A1) and adjusts the hardness of the cured product based on the added amount thereof.

Examples of such component (c1) include 1,3,5,7-tetramethyl cyclotetrasiloxane, tris(dimethylhydrogensiloxy) methylsilane, tris(dimethylhydrogensiloxy) phenylsilane, 1-(3-glycidoxypropyl)-1,3,5,7-tetramethyl cyclotetrasiloxane, 1,5-di(3-glycidoxypropyl)-1,3,5,7-tetramethyl cyclotetrasiloxane, 1-(3-glycidoxypropyl)-5-trimethoxysilylethyl-1,3,5,7-tetramethyl cyclotetrasiloxane, methylhydrogenpolysiloxanes blocked at both ends of a molecular chain with trimethylsiloxy groups, dimethylsiloxane-methylhydrogensiloxane copolymers blocked at both ends of a molecular chain with trimethylsiloxy groups, dimethylpolysiloxane blocked at both ends of a molecular chain with dimethylhydrogensiloxy groups, methylhydrogensiloxane-diphenylsiloxane copolymers blocked at both ends of a molecular chain with trimethylsiloxy groups, methylhydrogensiloxane-diphenylsiloxane-dimethylsiloxane copolymers blocked at both ends of a molecular chain with trimethylsiloxy groups, methyl tris(dimethylsiloxy) silane, tetrakis(dimethylsiloxysilane), methylhydrogenpolysiloxane blocked at both ends of a molecular chain with trimethylsiloxy groups, methylhydrogensiloxane-dimethylsiloxane copolymers blocked at both ends of a molecular chain with trimethylsiloxy groups, methylhydrogensiloxane-methylphenylsiloxane copolymers blocked at both ends of a molecular chain with trimethylsiloxy groups, hydrolytic condensation products of trimethoxysilane, copolymers containing a $(CH_3)_2HSiO_{1/2}$ unit and $SiO_{4/2}$ unit, copolymers containing a $(CH_3)_2HSiO_{1/2}$ unit, a $SiO_{4/2}$ unit, and a $(C_6H_5)SiO_{3/2}$ unit, and mixtures of two or more types thereof.

Examples of the organopolysiloxane serving as component (c1) include the following organopolysiloxanes. Note that in the formulae, Me and Ph represent a methyl group and a phenyl group, respectively, and b2, c2, d2, and e2 are each positive numbers. However, the sum of b2, c2, d2, and e2 in one molecule is 1.

$(HMe_2SiO_{1/2})_{b2}(PhSiO_{3/2})_{c2}$
$(HMePhSiO_{1/2})_{b2}(PhSiO_{3/2})_{c/2}$
$(HMePhSiO_{1/2})_{b2}(HMe_2SiO_{1/2})_{c2}(PhSiO_{3/2})_{d2}$
$(HMe_2SiO_{1/2})_{b2}(Ph_2SiO_{2/2})_{c2}(PhSiO_{3/2})_{d2}$
$(HMePhSiO_{1/2})_{b2}(Ph_2SiO_{2/2})_{c2}(PhSiO_{3/2})_{d2}$
$(HMePhSiO_{1/2})_{b2}(HMe_2SiO_{1/2})_{c2}(Ph_2SiO_{2/2})_{d2}(PhSiO_{3/2})_{e2}$

Note that component (c1) may an organohydrogenpolysiloxane as expressed by the following average unit formula:

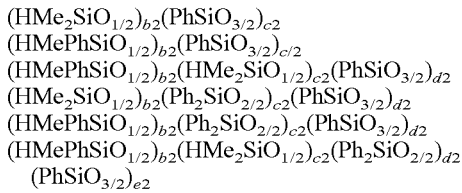

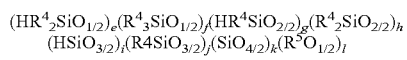

In the aforementioned average composition formula, R4 represents a group selected from monovalent saturated hydrocarbon groups having 1 to 12 carbon atoms and not having an aliphatic unsaturated bond, hydroxyl groups, and alkoxy groups. The monovalent saturated hydrocarbon group having 1 to 12 carbon atoms, the hydroxyl groups, and the alkoxy groups are the same as described above. $R^5$ represents a hydrogen atom or an alkyl group having 1 to 6 carbon atoms, and examples of an alkyl group having 1 to 6 carbon atoms include methyl groups, ethyl groups, propyl groups, butyl groups, hexyl groups, and the like. e, f, g, h, i, j, k, and l represent numbers satisfying the following conditions: e+f+g+h+i+j+k=1; 0≤l≤0.1; 0.01≤e+g+i≤0.2; 0.01≤e≤0.6; 0.01≤g≤0.6; 0≤i≤0.4; 0.01≤e+f≤0.8; 0.01≤g+h≤0.8; and 0≤i+j≤0.6.

Furthermore, the aforementioned constituent units of "$HR^4_2SiO_{1/2}$", "$R^4_3SiO_{1/2}$", "$HR^4SiO_{2/2}$", "$R^4_2SiO_{2/2}$", "$HSiO_{3/2}$", "$R^4SiO_{3/2}$", and "$SiO_{4/2}$" are units of the substructure of organohydrogenpolysiloxane called MH units, M units, DH units, D units, TH units, T units, and Q units, respectively. "$R^5O_{1/2}$" is a group bonded to an oxygen atom in the D unit, DH unit, T unit, TH unit, or Q unit, and refers to a hydroxyl group bonded to a silicon atom (Si—OH) in the organopolysiloxane or an alkoxy group bonded to a silicon atom remaining unreacted during manufacture of the organopolysiloxane. The MH units are primarily present at an end of a molecular chain of an organohydrogenpolysiloxane, and DH units are present in a molecular chain of the organohydrogenpolysiloxane.

Component (c2) is a straight chain organohydrogenpolysiloxane having a silicon-bonded hydrogen atom at an end of a molecular chain, which is a component that functions as a chain length extender in a hydrosilylation reaction with component (B)/component (A1) and improves the flexibility of a cured reactant.

Examples of such component (c2) include 1,1,3,3-tetramethyldisiloxane, 1,1,3,3,5,5-hexamethyltrisiloxane, dimethylpolysiloxanes blocked at both ends of a molecular chain with dimethylhydrogensiloxy groups, dimethylsiloxane-methylphenylsiloxane copolymers blocked at both ends of a molecular chain with dimethylhydrogensiloxy groups, dimethylpolysiloxanes blocked at both ends of a molecular chain with dimethylhydrogensiloxy groups, dimethylsiloxane-diphenylsiloxane copolymers blocked at both ends of a molecular chain with dimethylhydrogensiloxy groups, and mixture of two or more types of these organopolysiloxanes.

Furthermore, examples of such component (c2) further include the following organopolysiloxanes. Note that in the formulae, Me and Ph represent a methyl group and a phenyl group, respectively, m2 represents an integer from 1 to 100, and n2 represents an integer from 1 to 50.

$HMe_2SiO(Ph_2SiO)_{m2}SiMe_2H$
$HMePhSiO(Ph_2SiO)_{m2}SiMePhH$
$HMePhSiO(Ph_2SiO)_{m2}(MePhSiO)_{n2}SiMePhH$
$HMePhSiO(Ph_2SiO)_{m2}(Me_2SiO)_{n2}SiMePhH$

The amount of component (C) is an amount in which the silicon-bonded hydrogen atom in component (C) is 0.5 mols or more relative to 1 mol of the total amount of aliphatic unsaturated carbon-carbon bonds in the composition, and is preferably an amount of 0.5 to 50 mols of silicon-bonded hydrogen atoms, more preferably an amount of 0.5 to 10 mols, and even more preferably an amount of 0.5 to 2 mols, relative to 1 mol of al aliphatic unsaturated carbon-carbon bonds in the composition.

[Component (D)]

Component (D) is a hydrosilylation reaction catalyst that does not exhibit activity without irradiating with a high energy beam, but exhibits activity in a composition by irradiating a high energy beam Component (D) is a so-called high energy beam activated catalyst or photoactivated catalyst, which is known in the present technical field.

Examples of high energy beams include ultraviolet rays, gamma rays, X-rays, alpha rays, electron beams, and the like. In particular, examples include ultraviolet rays, X-rays, and electron beams irradiated from a commercially available electron beam irradiating device. Of these, ultraviolet rays are preferable from the perspective of efficiency of catalyst activation, and ultraviolet rays within a wavelength range of 280 to 380 nm are preferable from the perspective of industrial use. Furthermore, the amount of irradiation varies depending on the type of high energy beam activated catalyst, but in the case of ultraviolet rays, the integrated amount of irradiation at a wavelength of 365 nm is preferably within a range of 100 mJ/cm$^2$ to 10 J/cm$^2$.

Specific examples of component (D) include (methylcyclopentadienyl) trimethyl platinum (IV), (cyclopentadienyl) trimethyl platinum (IV), (1,2,3,4,5-pentamethyl cyclopentadienyl) trimethyl platinum (IV), (cyclopentadienyl) dimethylethyl platinum (IV), (cyclopentadienyl) dimethylacetyl platinum (IV), (trimethylsilyl cyclopentadienyl) trimethyl platinum (IV), (methoxycarbonyl cyclopentadienyl) trimethyl platinum (IV), (dimethylsilyl cyclopentadienyl) trimethylcyclopentadienyl platinum (IV), trimethyl (acetylacetonato) platinum (IV), trimethyl (3,5-heptanedionate) platinum (IV), trimethyl (methylacetoacetate) platinum (IV), bis(2,4-pentanedionato) platinum (II), bis(2,4-hexanedionato) platinum (II), bis(2,4-heptanedionato) platinum (II), bis(3,5-heptanedionato) platinum (II), bis(1-phenyl-1,3-butanedionato) platinum (II), bis(1,3-diphenyl-1,3-propanedionato) platinum (II), and bis(hexafluoroacetylacetonato) platinum (II). Of these, (methylcyclopentadienyl) trimethyl platinum (IV) and bis(2,4-pentanedionato) platinum (II) are preferred from the perspective of versatility and ease of acquisition.

The amount of component (D) is an amount required to further cure the composition and is preferably an amount in which metal atoms in the catalyst are within a range of 1 to 500 ppm based on mass units, and preferably within a range of 5 to 200 ppm, with regard to the composition.

[Curing Retarder]

The composition of the present invention may further contain a curing retarder. A curing retarder can inhibit a hydrosilylation reaction and delay a curing reaction. The curing retarder may be a single curing retarder or a mixture of two or more types of curing retarders.

Examples of curing retarders include: 2-methyl-3-butyn-2-ol, 3,5-dimethyl-1-hexr-3-ol, 2-phenyl-3-butyn-2-ol, and other alkyne alcohols; 3-methyl-3-penten-1-yne, 3,5-dimethyl-3-hexen-1-yne, and other enyne compounds; 1,3,5,7-tetramethyl-1,3,5,7-tetravinyl cyclotetrasiloxane; 1,3,5,7-tetramethyl-1,3,5,7-tetrahexenyl cyclotetrasiloxane; benzotriazole; triphenylphosphine; 1,2-bis(diphenylphosphino) ethane; and the like.

[Hydrosilylation Reaction Catalyst]

The compositions of the present invention may contain a hydrosilylation reaction catalyst that exhibits activity in the composition without irradiating with a high energy beam.

Examples of hydrosilylation reaction catalysts include platinum based catalysts, rhodium based catalysts, palladium based catalysts, nickel based catalysts, iridium based catalysts, ruthenium based catalysts, and iron based catalysts. Platinum based catalysts are preferable. Examples of the platinum based catalyst include platinum based compounds, such as platinum fine powders, platinum black, platinum-supporting silica fine powders, platinum-supporting activated carbon, chloroplatinic acids, alcohol solutions of chloroplatinic acids, olefin complexes of platinum, alkenylsiloxane complexes of platinum, and the like. Alkenylsiloxane complexes of platinum are particularly preferable. Exemplary alkenylsiloxanes include: 1,3-divinyl-1,1,3,3-tetramethyldisiloxane; 1,3,5,7-tetramethyl-1,3,5,7-tetravinyl-cyclotetrasiloxane; alkenyl siloxanes obtained by substituting a portion of methyl groups of the alkenylsiloxanes with an ethyl group, a phenyl group, or the like; and alkenylsiloxanes obtained by substituting a portion of vinyl groups of these alkenylsiloxanes with an allyl group, a hexenyl group, or the like. The platinum-alkenyl siloxane complex has favorable stability, and therefore 1,3-divinyl-1,1,3,3-tetramethyldisiloxane is particularly preferable. Furthermore, the stability of the platinum-alkenylsiloxane complex can be improved. Therefore, 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, and 1,3,5,7-tetramethyl-1,3,5,7-tetravinylcyclotetrasiloxane, or other alkenylsiloxane or dimethylsiloxane oligomers or other organosiloxane oligomers are preferably added to the complex, and an alkenylsiloxane is particularly preferably added to the complex. An example of other platinum based catalysts includes thermoplastic resin particles containing a platinum based catalyst.

The hydrosilylation reaction catalyst herein is a catalyst that exhibits activity without irradiating with a high energy beam, and a catalyst that exhibits activity even at a relatively low temperature is more preferable. Specific preferred examples include those that exhibit activity in a composition in a temperature range of 0 to 200° C. and promotes hydrosilylation reaction.

The amount of the hydrosilylation reaction catalyst depends on the type of catalyst and the type of composition, but usually the metal atoms in the catalyst are preferably within a range of 0.01 to 100 ppm based on mass units, and preferably 0.1 to 50 ppm, with regard to the composition.

[Other Components]

The composition of the present invention may contain, as necessary: another organopolysiloxane, an adhesion imparting agent, silica, glass, alumina, zinc oxide, or other inorganic fillers; a polymethacrylate resin or other organic resin fine powders; a phosphor, a heat resistance agent, a dye, a pigment, a flame retardant imparting agent, a solvent, or the like. The added amount and method of adding these optional components are known a person of ordinary skill in the art.

Although the composition of the present invention is preferably a solvent-free type, a solvent may be added to the composition of the present invention in order to make the composition of the present invention in a thin film form or to coat the composition in a desired pattern by printing, for example. The solvent that can be used is not limited to those that dissolve the composition of the present invention and provide a uniform solution. Specific examples include: normal hexane, normal pentane, normal octane, isooctane, decalin, and other aliphatic hydrocarbons; toluene, xylene, mesitylene, and other aromatic hydrocarbons; diisopropyl ether, dibutyl ether, tetrahydrofuran, and other ethers; ethyl acetate, butyl acetate, and other esters; propylene glycol monomethylether acetate, dipropylene glycol monomethylether acetate, and other glycol esters.

Manufacturing Method

The composition of the present invention can be manufactured by mixing components (A) to (D) and, if necessary, another optional component. The composition of the present invention may be mixed and prepared at the time of use, but is preferably mixed and prepared in advance, prior to use.

The composition of the present invention is preferably a one-component type in which components (A) to (D) coexist.

The composition of the present invention can be prepared, for example, by heating and kneading components (A) to (C) within a temperature range of 80° C. to 120° C. while adding and mixing component (D). In the aforementioned temperature range, the entire composition is softened and component (D) can be uniformly dispersed throughout, which is particularly beneficial in avoiding curing defects and partial cohesive failure during adhesion when molding a sheet or the like. On the other hand, if the temperature is less than the aforementioned lower limit, softening may be insufficient, and thus it may be difficult to uniformly disperse component (D) throughout even when using mechanical force. Conversely, if the temperature exceeds the aforementioned upper limit, component (D) reacts during mixing, and the entire body may become significantly thickened or hardened and thus lose heat meltability, which is not preferable. In particular, the composition of the present invention has a low melt viscosity at 100° C., and thus has excellent uniform mixability. A powder mixer used in the present manufacturing method is not limited, and can be: a kneader, a Banbury mixer, a Henschel mixer, a planetary mixer, a two-roll mill, a three-roll mill, a Ross mixer, a Labo Plastomill, or the like, or other batch type mixer, provided with heating and cooling functions; and a single-screw extruder, a twin-screw extruder, or other continuous type heating and kneading equipment, provided with heating and cooling functions. The mixer is not particularly limited, but is selected in accordance with the efficiency of the processing time and the ability to control the shear heat generation. In view of processing time, the mixer may be a continuous type, such as a single screw extruder, a twin screw extruder, or the like, or a batch type such as a Labo Plastomill or the like.

The curing reactive silicone composition of the present invention, which is non-fluid at 25° C. and also has heat meltability, is more preferably prepared by a manufacturing method including the following two steps:

Step 1: a step of removing an organic solvent from a solution, in which the organopolysiloxane resin of component (A) and a portion or all of a straight chain or branched diorganopolysiloxane of component (B) are dissolved in the organic solvent, at a temperature of 150° C. or higher to obtain a hot melt solid fraction; and Step 2: a step of adding the organohydrogenpolysiloxane of component (C) and the hydrosilylation reaction catalyst of the component (D) to the hot melt solid fraction obtained in step 1, and then kneading while heating and melting at a temperature of 120° C. or lower.

Step 1 is a step of mixing a hot melt silicone component, in other words, the organopolysiloxane resin of component (A), and a portion or all of the straight chain or branched organopolysiloxane (B). Moreover, in order to increase the mixing efficiency of both components, the components are first preferably dissolved in an organic solvent, and then the organic solvent is preferably removed at a temperature of 150° C. or higher, and preferably 200° C. or higher. Furthermore, a portion or all of the organohydrogenpolysiloxane of component (C) to be mixed in step 2 can also be combined and mixed in this step.

The step of dispersing or dissolving the organopolysiloxane resin of component (A), a portion n or all of the straight chain or branched organopolysiloxane (B), and another arbitrary component (excluding the hydrosilylation reaction catalyst of component (D)) in an organic solvent is typically a step of using a mixing or stirring device that utilizes a mechanical force. The organopolysiloxane resin of component (A) and the straight chain or branched organopolysiloxane of component (B) used in the present invention are soluble in an organic solvent. Furthermore, the aforementioned organopolysiloxane resin is generally industrially synthesized in a state of being dissolved in an organic solvent. Therefore, it is relatively easy to physically and uniformly mix a solution of the organopolysiloxane resin dissolved in an organic solvent with the aforementioned straight chain or branched organopolysiloxane in a solution system. The mixing or stirring device using a mechanical force is not particularly limited, and examples include kneaders, Banbury mixers, Ross mixers, Hobart mixers, dental mixers, planetary mixers, kneader mixers, homomixers, paddle mixers, line mixers, homo-dispers, propeller agitators, vacuum type kneaders, high speed dispersers, Labo Plastomills, Henschel mixers, and other batch type devices provided with heating and cooling functions.

The organic solvent is removed while heat treating the mixture containing the organic solvent at a temperature of 150° C. or higher, and preferably 200° C. or higher to obtain a hot melt solid fraction. Herein, removal of the organic solvent is preferably performed while performing uniform mixing, and can be performed in the aforementioned mixing or stirring device using a mechanical force, provided with heat treating means. However, step 1 of the present invention is particularly preferably uses a single-screw extruder, a twin-screw extruder, a continuous kneader, or other continuous type heating and kneading device provided with a heating function. Preferably, the aforementioned mixture containing the organic solvent is processed in a continuous heating and kneading device such as an extruder or the like heated to 200° C. or higher, such that the organic solvent can be removed and continuously recovered as a hot melt solid.

Step 2 is a step of mixing the organohydrogenpolysiloxane of component (C) and the hydrosilylation reaction catalyst of component (D) with the mixture of the organopolysiloxane resin of component (A) and the straight chain or branched organopolysiloxane of component (B) obtained in step 1. In the presence of the catalyst, raw materials are mixed without advancing a curing reaction, and in order to ultimately obtain a curable silicone composition having hot melt properties, temperature control in the step is an important element. In other words, it is important to shorten the heat history during the step, and particularly the exposure time to high temperature. The organopolysiloxane resin of component (A), the straight chain or branched organopolysiloxane of component (B), the organohydrogenpolysiloxane of component (C), and the optional component (B) are blended, and then the hydrosilylation reaction catalyst of component (D) is preferably blended. Moreover, the heating and kneading temperature after blending component (D) is preferably kept at 120° C. or lower. The temperature before blending component (D) may be performed at a temperature exceeding 120° C. (such as 150° C.), which may be preferable to improve mixing efficiency if temperature control is possible.

Furthermore, a portion of component (B) can also be blended alone or mixed with component (C) or (D) in advance. Note that step 2 is preferably performed under de-gassing conditions by a de-gassing mechanism such as a vacuum pump or the like in order to remove air bubbles described later from the composition.

Step 2 can be performed in a mixing or stirring device, which is a batch type device as described in step 1 and is further provided with a temperature controlling mechanism and preferably a de-gassing mechanism, but a continuous heating and kneading device such as a single-screw extruder, a twin-screw extruder, a continuous kneader or the like is preferably used from the perspective of being able to continuously introduce an additive at several points. A twin-screw extruder provided with a temperature controlling mechanism and a de-gassing mechanism is particularly preferably used.

In step 1, which is a preliminary stage to step 2, a hot melt mixture (compound) heated to 150° C. or higher is obtained. The mixture is a hot melt solid fraction, does not have fluidity at room temperature, and does not contain an organic solvent and other volatile components. Furthermore, the mixture has fluidity at a temperature of 150° C. or higher and therefore can be supplied (fed) as-is into the kneading device in step 2, and preferably a continuous heating and kneading device such as a twin-screw extruder or the like, unless a special cooling operation or the like is performed after step 1. On the other hand, when step 1 and step 2 are separated, the obtained hot melt mixture (compound) is reheated and melted while being supplied to the kneader used in step 2. This method includes using a bulk melter described later.

When step 2 is performed using a twin-screw extruder, the position and supplying order of each component to the twin-screw extruder are not particularly limited, and a plurality of components can be supplied at the same position. However, the hot melt solid fraction obtained in step 1 is preferably continuously supplied (fed) in a heated and melted state at the most upstream position (supply position 1), Component (C) is preferably continuously supplied (fed) at a downstream part thereof (supply position 2), and component (D) is preferably continuously supplied (fed) at an even more downstream part thereof (supply position 3). Thus, by sequentially introducing each component into the twin-screw extruder in which a screw is continuously rotating, each component can be efficiently mixed, and the temperature of a barrel containing the twin-screw extruder can be finely controlled, thereby achieving both high mixing efficiency and suppression and control of heat history during the step. For example, the temperature from supply position 1 to supply position 2, from supply position 2 to supply position 3, and from supply position 3 onward can be independently controlled, and even finer control is possible if necessary. For example, if the hydrosilylation reaction catalyst of component (D) can be supplied (fed) at the supply position 3 and then mixed at a temperature of 120° C. or lower, the temperature upstream therefrom can be controlled at a temperature exceeding 120° C. (such as 150° C.), which is preferable from the perspective of mixing efficiency.

Furthermore, step 2 is preferably performed under de-gassing conditions by a de-gassing mechanism such as a vacuum pump or the like in order to remove air bubbles from the composition.

In the foregoing, means of supplying (feeding) the hot melt solid fraction to the heating and kneading device is not particularly limited, but by using a metering pump having temperature controlling means (specific examples include tanks having heating and cooling functions and jackets for maintaining and controlling the temperature) and a supplying line, a constant amount of hot melt solid fraction per unit time can be supplied (fed) to a continuous heating and kneading device such as a twin screw extruder or the like. If the temperature of the solid fraction is controlled to be above the softening point thereof, and preferably 150° C. or higher in the metering pump, the hot melt solid fraction is supplied (fed) to the heating and kneading device in a heated and molten fluid state. Commercially available systems including such metering pumps can be used, and examples include Bulk Melt System manufactured by GRACO Inc., Bulk Melter manufactured by Nordson Corporation, and the like.

Furthermore, means of supplying (feeding) component (C) to the heating and kneading device is not particularly limited, but is selected from pumps having a constant-amount supply capability, in accordance with the viscosity at 25° C. and the supply amount. Examples include gear pumps, plunger pumps, press pumps, and the like.

If the hydrosilylation reaction catalyst of component (D) is solid at 25° C., the catalyst is preferably supplied a liquid master batch that has been mixed in advance with component (B). A supplying device is selected from pumps having a constant-amount supply capability, and examples include gear pumps, plunger pumps, press pumps, and the like.

In step 2, when a curing retarder is supplied, the curing retarder may be supplied together with the organohydrogenpolysiloxane of component (C), may be supplied together with the hydrosilylation reaction catalyst of component (B), or may be collectively mixed together with the mixing of components (A) and (B) in step 1.

As indicated in the method of manufacturing a pressure sensitive adhesive sheet described later, a pressure sensitive adhesive sheet can be manufactured by continuously performing the step of laminating between films provided with at least one release surface (step 3) and the step of stretching the obtained laminate body between rollers to form a curable silicone sheet having a specific film thickness (step 4), following the present step 2.

[Use of Composition]

The composition of the present invention is non-fluid at 25° C., has sufficient toughness, has the aforementioned heat meltability, and has sufficient pressure sensitive adhesion in an unreacted state, and therefore can be used by molding into a desired shape and can be used as a heat meltable pressure sensitive adhesive material by arranging on a specific adherend.

The heat meltability of the composition of the present invention is as described above. The composition of the present invention is preferably heated and melted at 80° C. or higher and then cooled, such that the composition can be processed into objects of various shapes, such as a sheet, a powder, or a tablet having a thickness of 5 μm to 5 mm. Specifically, the composition of the present invention can be heated and melted using a device having heating and extruding functions to process to the composition into an object of a desired shape. Note that so long as the curing reaction is not initiated by irradiating with a high energy beam such as ultraviolet rays or the like, the object retains curing reactivity and heat meltability, and therefore, the object is particularly preferably used as a heat meltable pressure sensitive adhesive material in the form of a member, a component, a sheet, or the like.

As described later, although the composition of the present invention is itself a pressure sensitive adhesive material, a curing reaction is performed by irradiating with ultraviolet rays or the like to form a cured product (including a semi-cured product) of a pressure sensitive adhesive material. Therefore, the composition of the present invention is useful as various potting agents, sealants, and adhesives/pressure sensitive adhesives, is preferably useful as an optical pressure sensitive adhesive/adhesive, and is particularly useful as an optical pressure sensitive adhesive/adhesive for a display. In particular, the composition of the present invention, in a state before the curing reaction, has sufficient pressure sensitive adhesive strength for temporary securing and has heat meltability, and therefore can form a pressure sensitive adhesive material layer having excellent gap fillability where recesses and protrusions and gaps of the adherend are easily followed. Furthermore, a cured product thereof has little coloration at high temperatures or under high temperature and high humidity, and does not easily become turbid, and therefore is extremely useful as a securing layer or adhesive layer between members of a laminate body such as a displaying device (display), a solar cell module, or the like.

The pressure sensitive adhesive strength of the composition of the present invention is not particularly limited, but in a state before a curing reaction, a test piece in which a curable layer with a thickness of 200 μm containing a curing reactive silicone composition is formed between two glass plates is preferably used, and the shear adhesive strength of the curable layer is preferably 0.1 MPa or more, as measured by a method specified in JIS K 6850.

[Semi-Curing Reaction (Formation of Thickened Body or Thermoplastic Body)]

The composition of the present invention has a property of initiating a curing reaction by irradiating with a high energy beam described later to form a cured product having pressure sensitive adhesion, but if necessary, only a partial curing reaction may be performed to form a semi-cured product. Herein, the "semi-cured state" refers to a state in which, as a result of the advancement of the curing reaction, the composition can form a thickened body that does not have fluidity in a low temperature range (15 to 80° C.) including room temperature (25° C.), in other words, a non-fluid, thermoplastic body that exhibits fluidity at 100° C., and still maintains curing reactivity, and in which the curing reaction proceeds further by setting curing conditions such as further continuing irradiation with a high energy beam, leaving to stand and heating, and the like. The cured reactant in the semi-cured state is referred to as a "semi-cured product". Note that as a result of the curing reaction progressing, the curing reaction of the composition stops, curing reactivity is lost, and a state is reached in which the curing reaction does not progress any further, which is referred to as the "main cured state". Furthermore, the thickened body also means that the viscosity at 25° C. is between 1.5 and 100 times the initial viscosity of the composition. Moreover, "thermoplastic body" means that the viscosity at 100° C. is 1,000,000 mPa·s or less.

The semi-curing reaction can be performed by an arbitrary method that limits curing before the composition of the present invention is fully or ultimately cured. For example, when activating component (D) with a high energy beam, semi-curing can be performed by limiting catalyst activation by limiting the amount of the high energy beam.

Alternatively, semi-curing can also be performed by blending a hydrosilylation reaction catalyst other than component (D) along with component (D) into the composition of the present invention and then performing the hydrosilylation reaction in a condition without irradiating with a high energy beam. In this case, for example, semi-curing is possible by heating the composition at a temperature of less than 150° C., preferably less than 125° C., even more preferably less than 100° C., and then performing a hydrosilylation reaction. The heating time depends on the type and blending amount of each component in the composition, but is usually 0.2 to 4 hours, and preferably 0.5 to 2 hours.

[Cured Product]

The curing reactive silicone composition of the present invention can form a cured product by irradiating the composition (or a semi-cured product thereof) of the present invention with a high energy beam such as ultraviolet rays or the like to activate the hydrosilylation catalyst, which is component (D), such that the hydrosilylation reaction in the composition proceeds. The types of high energy beam are as described above. The amount of irradiation depends on the type of the high energy beam activated catalyst, but in the case of ultraviolet rays, the integrated irradiation amount at 365 nm is preferably within a range of 100 mJ/cm² to 100 J/cm², may be within a range of 500 mJ/cm² to 50 J/cm², and may be within a range of 500 mJ/cm² to 20 J/cm². In other words, the curing reactive silicone composition of the present invention can initiate a curing reaction triggered by irradiation with a high energy beam such as ultraviolet rays or the like. Note that once the hydrosilylation catalyst, which is component (D), is activated, the curing reaction proceeds over time at room temperature or the like to form a cured product even after irradiation with a high energy beam is stopped.

The cured product of the present invention can be used as a variety of materials. The hardness of the cured product formed by curing the curing reactive silicone composition of the present invention is not particularly limited, and it is possible to form a cured product ranging from gel-like cured products having a degree of needle penetration of 70 or less as specified in JIS K 2220 (hereinafter, simply referred to as "degree of needle penetration") to relatively hard resin-like cured products having a Shore D hardness of 80, at 25° C.

The cured product of the present invention is preferably light transmissive, more preferably transparent. A light transmissive, and particularly a transparent cured product, can be preferably used in optical applications. The cured product of the present invention preferably has an optical path length of 6 mm measured in accordance with JIS K 7105, a parallel light transmission ratio at 25° C. of 90% or more, and parallel light transmission at 200° C. is preferably a value of 99% or more of the parallel light transmission ratio at 25° C.

The cured product of the present invention can have pressure sensitive adhesion. The adhesive strength or pressure sensitive adhesive strength of the cured product is not particularly limited. However, a cured product layer with a thickness of 200 μm containing the curing reactive silicone composition of the present invention is preferably formed between two glass plates, and the shear adhesive strength of the cured product layer is preferably 0.4 MPa or more, as measured by a method specified in JIS K 6850. Note that the releasing mode of the cured product of the present invention with regard to the adherend may be interfacial releasing or cohesive failure of the pressure sensitive adhesive material layer (permanent adhesion). In particular, by selecting component (B) of the composition of the present invention, the pressure sensitive adhesive strength of a pressure sensitive adhesive material layer containing the cured product and the adhesive mode to an adherend can be designed as desired, and in particular, design of a pressure sensitive adhesive material layer in which cohesive failure is less likely to occur when released from an adherend is also easy.

The cured product of the present invention can have a certain degree of elasticity or flexibility. Therefore, the cured product of the present invention may be used as an elastic pressure sensitive adhesive member.

[Pressure Sensitive Adhesive Material]

The curing reactive silicone composition of the present invention and a cured product can be used as a pressure sensitive adhesive material.

The pressure sensitive adhesive material of the present invention can be provided with a high adhesive strength and can favorably adhere or pressure sensitively adhere to various adherends. In addition, the pressure sensitive adhesive material of the present invention can form a pressure sensitive adhesive layer where cohesive failure does not easily occur when released from an adherend, but depending on the application, this may not be the case, and cohesive failure may occur.

Therefore, the behavior of the curing reactive silicone composition and a cured product pressure sensitive adhesive material layer thereof when released from an adherend can be preferably controlled based on the application. For example, in applications where a function as a pressure sensitive adhesive is expected, there may be no residue on a surface of the adherend, or only a small amount if any. On the other hand, it is not a problem to exhibit high adhesion that exhibits cohesive failure depending on the application.

Before the curing reaction, the curing reactive silicone composition of the present invention can be used as a heat meltable pressure sensitive adhesive material having excellent moldability, gap fillability, and pressure sensitive adhesive strength. Furthermore, a cured product of the curing reactive silicone composition of the present invention can be used as a pressure sensitive adhesive material having excellent pressure sensitive adhesive strength, although the cured product substantially loses heat meltability and curing reactivity. Therefore, the pressure sensitive adhesive material containing the curing reactive silicone composition may be temporarily secured to a member or formed on an adherend by forming a pressure sensitive adhesive material layer that utilizes gap fillability with regard to recesses and protrusions and gaps on the adherend, and then temporarily fixed, arranged, and adhered between adherends. Thereafter, the pressure sensitive adhesive material containing the curing reactive silicone composition may be irradiated with a high energy beam such as ultraviolet rays or the like to form a pressure sensitive adhesive material layer containing the cured product between the adherends. Furthermore, the pressure sensitive adhesive material containing the cured product of the curing reactive silicone composition of the present invention can itself be used as a pressure sensitive adhesive material. Therefore, the pressure sensitive adhesive material may be molded into a sheet shape of the like utilizing the heat meltability of the curing reactive silicone composition of the present invention, and then cured, and may be treated independently as a pressure sensitive adhesive member having a desired shape.

[Laminate Body]

Furthermore, a laminate body can be provided with a layer containing the curing reactive silicone composition of the present invention or a layer or member containing a cured product of the composition. The laminate body is not particularly limited, and may be a pressure sensitive adhesive sheet (including adhesive sheets and pressure sensitive adhesive (PSA) sheets), or a releasable laminate body where the adhesive sheets are laminated to a sheet-like member having a release layer, or may be at least one type of article selected from displaying devices, electronic components, and solar cell modules, provided with a layer containing the curing reactive silicone composition or a layer containing a cured product obtained by curing and reacting the composition.

[Pressure Sensitive Adhesive Sheet]

The pressure sensitive adhesive sheet of the present invention has at least one pressure sensitive adhesive material layer containing the curing reactive silicone composition of the present invention or a cured product thereof (including a semi-cured product) on at least one sheet substrate. Note that the pressure sensitive adhesive sheet includes adhesive sheets or a pressure sensitive adhesive sheets for the purpose of crimping, and the adhesive state may be interfacial releasing upon releasing from an adherend, or a permanent adhesive state with cohesive failure of the pressure sensitive adhesive material layer upon releasing.

The pressure sensitive adhesive material layer of the pressure sensitive adhesive sheet of the present invention is the curing reactive silicone composition of the present invention (uncured product), a semi-cured product of the above, or main cured product, and is provided as an uncured, semi-cured, or main cured state selected according to the application and purpose of use thereof. The pressure sensitive adhesive material of the present invention has no fluidity at 25° C., is in an uncured state, has sufficient pressure sensitive adhesive strength for temporary securing, can form a pressure sensitive adhesive material layer that can be freely molded by heating and melting, and can be used as follows, for example. Note that it goes without saying that the following uses are essentially impossible in pressure sensitive adhesive layers containing a normal cured product.

[Method of Using Pressure Sensitive Adhesive Sheet]

The pressure sensitive adhesive sheet of the present invention can be used, for example, in the following manner. In other words, the pressure sensitive adhesive sheet containing the composition of the present invention in an uncured or semi-cured state and provided with a heat meltable pressure sensitive adhesive material layer is formed on a sheet provided with a release layer (release film). Next, the pressure sensitive adhesive sheet is released from the release film, and after the pressure sensitive adhesive sheet is pressure sensitive adhered to the substrate (adherend) intended for an exposed pressure sensitive adhesive material layer, the pressure sensitive adhesive sheet is heated above the melting temperature of the pressure sensitive adhesive material layer. The present operation allows the pressure sensitive adhesive layer to properly adhere to a surface of the substrate and to follow any steps or the like on the surface. A second substrate can be arranged on the pressure sensitive adhesive layer formed through curing and releasing operations, and both can be pressure sensitive adhered together. If the substrate is a substrate having a transparent or transmissive part for a high energy beam such as ultraviolet rays or the like, a laminate body can be configured by irradiating the pressure sensitive adhesive material layer with a high energy beam such as ultraviolet rays or the like after pressure sensitive adhering the substrate under a certain temperature in an uncured state.

[Configuration of Pressure Sensitive Adhesive Sheet]

The type of the aforementioned sheet-like substrate is not particularly limited, and examples include paperboard, cardboard paper, clay-coated papers, polyolefin laminate papers, particularly polyethylene laminate papers, synthetic resin films and sheets, natural fiber woven materials, synthetic fiber woven materials, artificial leather woven materials, and metal foils. In particular, synthetic resin films and sheets are preferable, with exemplary synthetic resins including: polyimides, polyethylenes, polypropylenes, polystyrenes, polyvinyl chlorides, polyvinylidene chlorides, polycarbonates, polyethylene terephthalates, cyclopolyolefins, and nylons. When heat resistance is required, a heat-resistant synthetic resin film such as a polyimide, polyetheretherketone, polyethylene naphthalate (PEN), liquid crystal polyacrylate, polyamide-imide, polyether sulfone, and the like is particularly preferable. Meanwhile, for applications such as a display device in which visibility is required, a transparent substrate and specifically a transparent material such as a polypropylene, polystyrene, polyvinylidene chloride, polycarbonate, polyethylene terephthalate, PEN, and the like is preferable.

The thickness of the aforementioned sheet-like substrate is not particularly limited, and can be designed at a desired thickness based on the application.

On the other hand, when the thickness of the pressure sensitive adhesive sheet of the present invention is designed to be thin, a step of stretching a molten product as is by a roller or the like, a rolling step by a heat press or the like, or other step is required as described later, and the sheet substrate may also be exposed to heat and pressure and may be deformed. Therefore, a sheet substrate with a required thickness is preferably used. For example, in the case of polyethylene terephthalate, the thickness is preferably 50 μm or more, and even more preferably 75 μm or more, and depending on the conditions and intended use, a thicker substrate up to approximately 300 μm can be used.

Furthermore, in order to improve adhesion between a supporting film and a release layer described layer or pressure sensitive adhesive layer, a supporting film subjected to a primer treatment, corona treatment, etching treatment, or plasma treatment may be used. Furthermore, an opposite surface of the film-like substrate from the pressure sensitive adhesive layer surface may be subjected to a surface treatment such as a treatment for scratch prevention, grime prevention, fingerprint adhesion prevention, anti-glare, anti-reflection, anti-static, or other treatment.

In the pressure sensitive adhesive sheet of the present invention, sheet-like substrate is preferably provided with at least one release layer, and the release layer is preferably in contact with the pressure sensitive adhesive material layer. Thereby, the pressure sensitive adhesive material layer can be easily released from the sheet-like substrate. The release layer may also be referred to as a release liner, a separator, a release layer, or a release coating layer, and may preferably be a release layer having a release coating ability such as a silicone based release agent, a fluorine based release agent, an alkyd based release agent, a fluorosilicone based release agent, or the like, may be formed with fine recesses and protrusions physically formed on a substrate surface, or may be a substrate itself which is not prone to adhere to an adhesive material layer containing the curing reactive silicone composition of the present invention or a cured product thereof.

In particular, in the laminated body of the present invention, a release layer obtained by curing a fluorosilicone based release agent is preferably used as the release layer.

Herein, the fluorosilicone based release agent is a curable organopolysiloxane composition containing one or more types of an organopolysiloxane having a substitution group containing fluorine bonded to a silicon atom in one molecule, and a curable organopolysiloxane composition is particularly preferably used, which contains one or more types of an organopolysiloxane containing a substitution group containing a fluorine group selected from perfluorobutylethyl groups and other fluoroalkyl groups and perfluoropolyether groups in one molecule. Note that the organopolysiloxane containing a substitution group containing a fluorine group may further have a curing reactive group such as an alkenyl group or the like within the same molecule, and two or more types of organopolysiloxanes containing different substitution groups containing a fluorine group may be combined and used at a specific mixing ratio.

When the pressure sensitive adhesive sheet of the present invention has a structure in which the curable reactive silicone composition of the present invention or a cured product thereof (including a semi-cured product) is laminated between two sheet substrates, the pressure sensitive adhesive sheet is preferably designed such that there is a certain difference in release forces between the sheet substrates and the pressure sensitive adhesive silicone composition. The release force can be controlled based on the selection of the fluorosilicone based release agent described above, the selection of a crosslinking structure and crosslinking density, and the thickness of the release layer. In implementing the present invention, a release coating film having an appropriate release force may be selected from commercially available products, or a film may be appropriately designed and used to provide the desired release properties.

[Method of Manufacturing Pressure Sensitive Adhesive Sheet]

The pressure sensitive adhesive sheet of the present invention can be manufactured, for example, by heating and melting the curing reactive silicone composition (uncured product) of the present invention as necessary, coating onto the sheet-like substrate to form a pressure sensitive adhesive sheet of a predetermined thickness, and leaving as is, or semi-curing or main curing the pressure sensitive adhesive layer if necessary. Note that the formation of uncured, semi-cured and main cured states and the advantages of each state are as described above, and can be used as required. Hereafter, the pressure sensitive adhesive sheet may be referred to as a "sheet containing the curable reactive silicone composition".

As a method of coating to the sheet-like substrate, an air knife coating, a curtain coating using a curtain flow coater or the like, a comma coating, a Meyer bar, a die coating, a gun having a heating/pressurizing function, an applicator, a dispenser or a forming machine, a pail or a drum pump having a heating/pressurizing/suctioning function, single- or twin-screw continuous extruders, and other known methods used for forming the layers can be used without limitation. When the curing reactive silicone composition (uncured product) of the present invention is coated, the composition melted by heating to 80° C. or higher is particularly preferably coated, and may be coated by heating and melting using a device having the aforementioned heating and extruding functions. Furthermore, the thickness of the sheet of the present composition coated in sheet-like form is preferably controlled to a specific thickness using a batch type cooling press, a rotating roller, or the like.

The pressure sensitive adhesive sheet of the present invention is more preferably prepared by a manufacturing method including the following two steps in addition to step 1 and step 2 preferable for manufacturing the curing reactive silicone composition.

Step 3: a step of laminating the mixture after heating and melting obtained in step 2 between sheet substrates provided with at least one release surface; and Step 4: a step of stretching the laminate body obtained in step 3 between rollers to mold a sheet containing a curing reactive silicone composition having a specific film thickness.

Furthermore, in steps 3 and 4, manufacturing is preferably performed by a device designed to allow continuous operation following step 2 described above, not only to improve the overall efficiency of the manufacturing, but also to reduce the heat history during the process, and particularly the time of exposure to high temperatures, to a short time.

Furthermore, a curing reactive silicone composition having a melt viscosity of 100,000 Pa·s or less at 100° C. is preferably used, step 3, the step of stretching the molten product implemented in step 4 using a roller or the like as is, the rolling step using a heat press, or the like can be performed at a lower temperature and under a lower pressure.

Step 3 is a step of laminating the mixture after heating and melting obtained in step 2 between sheet substrates provided with at least one release surface, and is a preliminary step for pressure molding in step 4. By forming a laminate body in which the mixture obtained in step 2 is sandwiched between the sheet substrates, a sheet-like molded product can be obtained by pressure molding by roller stretching from the releasable sheet, and after molding, only the releasable sheet can be removed from the sheet-like molded product using the release surface.

In step 3, the mixture after heating and melting obtained in step 2 prior thereto is laminated between two sheet substrates. Depending on the form of use of the sheet containing the obtained curing reactive silicone composition, the two sheet substrates preferably both have a release surface, and in step 3, the mixture obtained in step 2 is particularly preferably laminated between the release surfaces of the sheet substrates. By adopting such laminated form, a laminate sheet where the thin layer sheet containing the curing reactive silicone composition is interposed between releasable sheets and which can be released from both sides can be obtained through the pressure molding in step 4 and then optional cutting. At the time of use, only the sheet containing the curing reactive silicone composition (=pressure sensitive adhesive sheet) can be exposed by peeling off the releasable sheet substrate on both surfaces without concern for damaging the formed sheet containing the curing reactive silicone composition.

In step 3, the mixture obtained in step 2 is optionally temporarily molded and then laminated onto the two sheet substrates. The step is not particularly limited, but the mixture obtained in step 2 is supplied by being discharged or coated onto the release layer of one sheet substrate, and a laminate body is formed by adhering the release layer of the other sheet substrate from on the mixture. At this time, in the step of manufacturing a sheet containing a continuous curing reactive silicone composition, each sheet substrate is transported via a rotating roller to a supply position of the mixture in step 2, and a lamination operation between films is performed. The diameter and width of the rotating roller are not particularly limited, but the structure is preferably capable of uniform pressure in a width direction. The pressurizing method is not particularly limited, but an air cylinder or hydraulic system is preferred.

The supply rate of the mixture obtained in step 2 between the sheet substrates in step 3 can be designed based on the manufacturing speed and scale thereof. As an example, the mixture obtained in step 2 can be supplied between the sheet substrates at a supply rate of 1 to 10 kg/hour, but needless to say, is not limited thereto. However, in step 3, the amount of the mixture obtained in step 2 that is laminated between the sheet substrates must be determined based on the average thickness of the sheet containing the curing reactive silicone composition that designed in step 4, and must be a thickness that allows rolling processing in step 4.

If the mixture obtained in step 1 has a low heat melt viscosity and is highly fluid, in Process 3, the mixture after heating and melting obtained in step 2 is preferably discharged while being molded into a sheet or string shape (including a rod-shaped molded product discharged from a narrow diameter hole portion) using a die and a nozzle and then laminated between sheet substrates. Herein, the die is used to temporarily mold the mixture, and although the type of the die and the thickness at the time of the temporary molding are not particularly limited, the mixture can be and is preferably temporarily molded into an essentially sheet shape having a thickness within a range of 100 to 2000 μm (=2 mm) using a T-die or a strand die equipped with a structure capable of heating. Furthermore, if necessary, a die may be used, in which the discharge port of these T-dies or strand dies is deformed into a flattened shape with respect to a discharge surface (horizontal direction).

If the mixture obtained in step 2 has a low heat melt viscosity and is highly fluid, a step of cooling or adjusting the temperature of the entire laminate body obtained in step 3 is preferably included as a step prior to step 4 or in step 4, after the temporary molding described above. This is because the heated molten product is cooled to a solid state to effectively perform pressure molding in step 4. The cooling step is not particularly limited, but can be performed by cooling the mixture supplied or laminated on the sheet substrate by a cooling roller, cold air, or the like within a range of −50° C. to room temperature using cooling means such as air cooling, a cooling solvent, or the like.

On the other hand, if the mixture obtained in step 2 has a high heat melt viscosity and low fluidity, and if the entire laminate body is cooled in step 3, the viscosity of the mixture becomes too high, and thus the film thickness is difficult to control. Therefore, a step of adjusting the temperature of the entire laminate body between 80 and 120° C. is preferably included as a step prior to step 4 or as step 4. Note that details of temperature control will be described in step 4.

[Step 4]

Step 4 is a step in which the laminate body obtained in step 3 described above is stretched between rollers to form a sheet containing the curing reactive silicone composition having a specific film thickness, and in which the mixture obtained in step 2 is applied and stretched on from the sheet substrate to mold a uniform sheet. The number of pairs of rolling rollers may be single or a plurality.

The rolling step in step 4 can be performed on the laminate body obtained in step 3 using a known rolling method such as roller rolling or the like. In particular, roller rolling has an advantage where the sheet containing the curing reactive silicone composition with a desired thickness can be designed by adjusting a gap between rollers. For example, a sheet having excellent flatness and very few defects on the sheet surface and inside the sheet can be obtained by adjusting the gap between the rollers to a constant level where the average thickness is within a range of 10 to 2000 μm, and then rolling. More specifically, for roller rolling, the gap between the rollers is particularly preferably adjusted to be within a range of 1.5 to 4.0 times the average thickness of the target sheet containing the curing reactive silicone composition.

By stretching in accordance with step 4, an essentially flat, 10 to 2000 μm thick sheet containing the curing reactive silicone composition can be obtained. By roller stretching the mixture after heating and melting in step 2 in the form of a laminate body between the release films in accordance with step 3, a releasable laminate body containing a pressure sensitive adhesive sheet having hot melt properties, which has low defects and excellent handling workability by releasing, can be obtained. Furthermore, by attaching a film thickness meter, the film thickness can be measured with regard to the laminate body obtained in step 3. Thus, adjustment of the film thickness is easy and the film thickness can be managed.

[Temperature Adjustment in Step 4]

In step 4, when the laminate body obtained in step 3 is stretched between rollers, the rollers are preferably further provided with a temperature controlling function to control the temperature of the entire laminate body during roller rolling and to perform heating or cooling as necessary. Adjusting the temperature has benefits where a gap between the rollers can be stably maintained, and the flatness and uniformity (uniformity of film thickness) of the obtained pressure sensitive adhesive sheet having hot melt properties can be improved. A specific range of temperature adjustment can be designed as appropriate based on the heat resistance of the sheet substrate, the thickness of the pressure sensitive adhesive sheet (design thickness), reactivity thereof, and the like, but is generally within a range of 5 to 120° C.

If the melt viscosity of the mixture after heating and melting obtained in step 2 is high, the viscosity of the mixture may become too high if the temperature of the mixture has significantly dropped at the time of lamination by rollers, and thus the film thickness is difficult to control. In order to avoid this, if the mixture has a high heat melt viscosity, supplying to the rotating rollers is required without reducing the temperature of the mixture. The mixture can be supplied to the rotating rollers at essentially the same temperature as an outlet port temperature of the heating and kneading device, and the viscosity can be prevented from increasing; by heating the rollers themselves to a temperature range of 80 to 120° C., and by narrowing the distance between the rollers and a die, which is an outlet port of a continuous heating and kneading device such as a twin-screw extruder or the like, as much as possible, or performing another treatment.

On the other hand, if the temperature of the mixture or the roller itself is significantly higher than 120° C., there is a concern that the reaction of the heat curable mixture may advance or, if the heat resistance of the film used is low, the film may wrinkle during stretching, and therefore, precise temperature control is required in this step.

[Control of Time from Start of Step 2 to End of Step 4]

Although the aforementioned steps 2 to 4 are continuous steps from the perspective of industrial mass production, when a thermosetting composition is treated as a hot melt composition, and if the composition is exposed to a high temperature for a long period of time from a certain point (Supply Point 2) of step 2 as described above, a curing reaction of the composition may advance, and the curability of the ultimately obtained sheet containing the hot melt curing reactive silicone composition may be adversely affected. In order to prevent this, temperature control during the aforementioned mixing is important. Furthermore, the time from the end of step 2 to the start of cooling of the obtained sheet after the end of step 4 is a short time, specifically, preferably within 30 minutes, more preferably within 15 minutes, and even more preferably within 5 minutes. When the time of exposure to a high temperature in the manufacturing process is within the aforementioned range, a sheet with excellent hot melt properties can be manufactured without the reaction advancing even if a sheet containing a thermosetting curing reactive silicone composition is produced.

[Cutting Step]

Step 4 can obtain a releasable laminate body in which a sheet containing a hot melt curable reactive silicone composition is interposed between the releasable sheets and may optionally include a step of cutting the laminate body containing the sheet. Thereby, a releasable laminate body containing hot melt sheet of a desired size can be obtained.

A cutting device is not limited, but a device that can cut continuously in width and length directions is preferable, and the line speed is preferably adjustable. A sheet cutter manufactured by SOLUTECH can be used for continuous cutting. If the cutting device has a foreign material inspecting machine, foreign material can be detected, marked, and removed before cutting.

[Pass Line after Rotating Roller]

Furthermore, with step 4, a sheet containing a hot melt curing reactive silicone composition is disposed between the releasable sheets to form a releasable laminate body, but when an extreme U-shaped pass line is present, a film tends to peel from a silicone sheet.

Therefore, the pass line is preferably straight after the stretching rotating rollers. For this reason, winding the film with a winding device or the like is preferably avoided before the cutting step, and the film is preferably continuously cut to a desired size in the cutting step.

[Optional Step for Quality Control or the Like]

With step 4, a sheet containing a hot melt curing reactive silicone composition is disposed between the releasable sheets to form a releasable laminate body, but thereafter, may and preferably includes a step for the purpose of quality control for practical purposes (such as a step of measuring characteristic values or controlling the presence of foreign material). The step is preferably performed by a foreign material detecting device provided with optical measuring means such as a camera, video, or the like.

The pressure sensitive adhesive sheet of the present invention may be used by, for example, irradiating a pressure sensitive adhesive layer containing the curing reactive silicone composition in an uncured state with a high energy beam after applying the pressure sensitive adhesive layer to the adherend to cure the curing reactive silicone composition included in the pressure sensitive adhesive layer and then releasing the cured pressure sensitive adhesive layer from the sheet-like substrate. Similarly, the pressure sensitive adhesive sheet of the present invention may be used by releasing the pressure sensitive adhesive material layer containing the curing reactive silicone composition in an uncured or semi-cured state from the sheet-like substrate. In other words, in the pressure sensitive adhesive sheet of the present invention, the pressure sensitive adhesive material layer may be in any of uncured, semi-cured and main cured states, so long as the pressure sensitive adhesive material layer is derived from the curing reactive silicone composition described above.

When the pressure sensitive adhesive material layer of the pressure sensitive adhesive sheet of the present invention contains the curing reactive silicone composition in an uncured or semi-cured state, the pressure sensitive adhesive material layer has heat meltability. Therefore, after being applied to a pressure sensitive adhesive material layer adherend, the pressure sensitive adhesive layer is heated prior to irradiating with a high energy beam. Thus, the pressure sensitive adhesive layer can be softened or fluidized and, for example, the pressure sensitive adhesive layer can be filled without any gaps, even if recesses and protrusions is present on an adhering surface of the adherend. Examples of heating means of the pressure sensitive adhesive sheet that can be used include various thermostatic baths, hot plates, electromagnetic heating devices, heating rollers, and the like. In order to perform more efficient adhering and heating, for example, an electric heat pressing machine, a diaphragm type laminator, a roller laminator, or the like is preferably used.

At this time, if the softening temperature of the pressure sensitive adhesive material layer is 50° C. or higher, the processing characteristics and storage characteristics at room temperature can be made sufficient. On the other hand, if the softening temperature of the pressure sensitive adhesive layer is 100° C. or lower, not only can heat damage to an image displaying panel or the like be suppressed, but the pressure sensitive adhesive layer can be prevented from flowing too much and protruding. Therefore, the softening temperature of the pressure sensitive adhesive layer is preferably 50 and 100° C., more preferably 55° C. or higher and 95° C. or lower, and even more preferably 60° C. or higher and 90° C. or lower.

On the other hand, if the thickness of the pressure sensitive adhesive layer is too thin, the pressure sensitive adhesive layer may not sufficiently be able to follow recesses and protrusions on an adhering surface, or may not exhibit sufficient adhesive strength. From this perspective, the thickness of the pressure sensitive adhesive layer is preferably 20 to 500 µm, more preferably 25 µm or more and 350 µm or less, and even more preferably 50 µm or more or 250 µm or less.

In one aspect, the pressure sensitive adhesive sheet of the present invention contains:
at least one sheet-like substrate; and
at least one pressure sensitive adhesive material layer formed on the sheet-like substrate; where the pressure sensitive adhesive material layer contains the curing reactive silicone composition or a cured product thereof (including a semi-cured product).

Furthermore, in another aspect of the pressure sensitive adhesive sheet of the present invention, there may be two sheet-like substrates.

For example, the pressure sensitive adhesive sheet of the present invention contains:
a first sheet-like substrate;
a second sheet-like substrate; and
at least one pressure sensitive adhesive material layer formed between the first sheet-like substrate and the second sheet-like substrate; where
the pressure sensitive adhesive material layer may be in a form contacting the first sheet substrate and the second sheet substrate.

The pressure sensitive adhesive sheet in the aforementioned form can be obtained, for example, by sandwiching the curable reactive silicone composition of the present invention between the first sheet-like substrate and the second sheet-like substrate and then molding to a certain thickness by pressing or rolling while heating. Note that in this case, the pressure sensitive adhesive material layer is a heat meltable pressure sensitive adhesive material layer containing the curing reactive silicone composition in an uncured state. On the other hand, manufacturing is also possible by a similar method by sandwiching the curing reactive silicone composition of the present invention between the first and second sheet-like substrates, molding the composition to a certain thickness, and then irradiating the composition with a high energy beam such as ultraviolet rays or the like. In this case, the pressure sensitive adhesive material layer is a pressure sensitive adhesive material layer containing a cured product of the curing reactive silicone composition.

The first sheet-like substrate may be provided with a first release layer, or the first sheet-like substrate itself may be provided with releasability. Similarly, the second sheet-like substrate may be provided with a second release layer, or the second sheet-like substrate itself may be provided with releasability. When the first sheet-like substrate and/or the second sheet-like substrate is provided with the first release layer and/or the second release layer, the pressure sensitive adhesive material layer containing the curing reactive silicone composition of the present invention or a cured product thereof (including a semi-cured product) is preferably in contact with the first release layer and/or the second release layer. Moreover, if the pressure sensitive adhesive material layer is molded into a sheet, the pressure sensitive adhesive material layer and the release surface are preferably adhered together so as to face each other to configure a releasable laminate body. The aforementioned pressure sensitive adhesive material layer can be used as a pressure sensitive adhesive sheet, for example, by releasing the pressure sensitive adhesive material layer from the sheet-like substrate after applying the pressure sensitive adhesive material layer to an adherend.

The first or second sheet-like substrate that may have a release layer is similar to the sheet-like substrate (such as a film of synthetic resin or the like) already exemplified, and the release layer thereof is also similar to the release layer already exemplified. Furthermore, the first sheet substrate and/or the second sheet substrate may be light transmissive, and are more preferably transparent. If either sheet-like substrate is transparent, when forming a pressure sensitive adhesive material layer containing the curing reactive silicone composition of the present invention, irradiation with a high energy beam can be performed through the first sheet-like substrate or the second sheet-like substrate. Moreover, the pressure sensitive adhesive material layer containing the curing reactive silicone composition of the present invention can be changed into a pressure sensitive adhesive material layer containing a cured product of the composition.

In the pressure sensitive adhesive sheet of the present invention, the thickness of the pressure sensitive adhesive material layer is preferably 20 to 500 µm, more preferably 25 µm or more and 350 µm or less, and even more preferably 50 µm or more or 250 µm or less. However, it is not limited to these thicknesses.

[Article]

The pressure sensitive adhesive material containing the curing reactive silicone composition of the present invention or a cured product thereof can be used to adhere various objects. Furthermore, the pressure sensitive adhesive material of the present invention can be used to manufacture a laminate body as an article of the present invention.

Thus, the present invention also relates to a laminate body, which is an article containing:
at least one base; and
at least one pressure sensitive adhesive material component; where
the pressure sensitive adhesive material component contains a pressure sensitive adhesive material containing the curing reactive silicone composition of the present invention or a cured product thereof.

The shapes of the base and the pressure sensitive adhesive material component are arbitrary and can be various three-dimensional shapes.

The pressure sensitive adhesive material component can be present on or in the base. Preferably, at least a portion of the base is adhered to the pressure sensitive adhesive material component.

The pressure sensitive adhesive material component has a pressure sensitive adhesive strength and can be favorably adhered to various bases. Furthermore, the base may be permanently adhered by the pressure sensitive adhesive material component, and the pressure sensitive adhesive material component can be designed in an adhesion mode in which no cohesive failure occurs when the pressure sensitive adhesive material component is released from the base, resulting in interfacial releasing.

Similarly, the present invention also relates to an article containing:
  at least one substrate; and
  at least one pressure sensitive adhesive material layer; where
  the pressure sensitive adhesive material layer contains a pressure sensitive adhesive material containing the curing reactive silicone composition of the present invention or a cured product thereof.

The shape of the substrate is a sheet or a film, and the shape of the pressure sensitive adhesive material layer is a layer. Preferably, at least a portion of a surface of the substrate is adhered to the pressure sensitive adhesive material layer. The properties of the pressure sensitive adhesive material layer are as described above.

A plurality of the bases or substrates can be present. In this case, the pressure sensitive adhesive material layer can be present between the plurality of bases or substrates and preferably bonds the plurality of bases or substrates to each other.

The base or substrate may be either porous or non-porous.

Examples of the porous base or porous substrate include woven materials, non-woven materials, paper and other fiber products, synthetic resin films/sheets made porous by stretching or the like, and combinations thereof. The fiber may be a natural fiber, a synthetic fiber, or a mixture thereof.

In an article of the present invention provided with a porous base or a porous substrate, the pressure sensitive adhesive material of the present invention can be present in at least a portion of the pores of the base or substrate. In this case, for example, the articles can be manufactured by impregnating (including impregnating and cooling in a heated molten state) a base substrate or substrate, such as fabric, paper, or the like with the composition of the present invention and, if necessary, further irradiating with a high energy beam, such as ultraviolet rays or the like to perform curing.

Examples of the non-porous base or non-porous substrate include synthetic resin films/sheets, metal foils, and combinations thereof.

In particular, synthetic resin films and sheets are preferable, with exemplary synthetic resins including: polyimides, polyethylenes, polypropylenes, polystyrenes, polyvinyl chlorides, polyvinylidene chlorides, polyvinyl alcohols (PVA), polycarbonates, polyethylene terephthalates, cyclopolyolefins, and nylons. When heat resistance is required, a heat-resistant synthetic resin film such as a polyimide, polyetheretherketone, polyethylene naphthalate (PEN), liquid crystal polyacrylate, polyamide-imide, polyether sulfone, and the like is particularly preferable. Meanwhile, for applications such as a display device in which visibility is required, a transparent material such as a polypropylene, polystyrene, polyvinylidene chloride, PVA, polycarbonate, polyethylene terephthalate, PEN, mixtures thereof, and the like is preferable.

The thickness of the aforementioned substrate is not particularly limited, and can be designed at a desired thickness based on the application. Furthermore, in order to improve adhesion between a substrate and pressure sensitive adhesive layer, a substrate subjected to a primer treatment, corona treatment, etching treatment, or plasma treatment may be used. Furthermore, an opposite surface from a surface contacting from the pressure sensitive adhesive layer of the substrate may be subjected to a surface treatment such as a treatment for scratch prevention, grime prevention, fingerprint adhesion prevention, anti-glare, anti-reflection, anti-static, or the like.

A plurality of the pressure sensitive adhesive materials can be present. By using a plurality of pressure sensitive adhesive material layers, various characteristics required of an adhesive layer can be exhibited in a balanced manner.

The pressure sensitive adhesive component or the pressure sensitive adhesive layer is useful as a member for various electronic devices or electrical devices. In particular, the shear storage elastic modulus G' of the pressure sensitive adhesive component or pressure sensitive adhesive layer at 25° C. (room temperature) is within a range of 0.01 to 15 MPa (more preferably within a range of 0.1 to 10 MPa, and even more preferably within a range of 0.2 to 5 MPa). When present, the pressure sensitive adhesive component or the pressure sensitive adhesive layer is useful as an elastic pressure sensitive adhesive component or an elastic pressure sensitive adhesive layer as an electronic component or member for transducers (including sensors, speakers, actuators, and generators).

The pressure sensitive adhesive material may be either non-transparent or transparent.

Non-transparent or low light transmissive pressure sensitive adhesive materials are useful for film or sheet-like components used in sensors, speakers, actuators, and the like, where transparency is not required and a certain degree of elasticity or flexibility is required for the components or layers themselves described above. Furthermore, it is also useful as an sealing material or adhesive material used in secondary batteries such as lithium ion batteries and the like, or fuel cells.

Transparent or highly light transmissive pressure sensitive adhesive materials are useful for optical device applications. In this case, the base or the substrate is preferably a member for an optical device. For example, the substrate can be an optical film such as an image displaying panel, a touch panel, a polarizing film, a phase difference film, a color filter, a viewing angle expanding film, a brightness enhancing film, a reflection sheet, or a front surface or back surface protective sheet. Thus, the pressure sensitive adhesive layer can, for example, bond a front surface protective sheet and an optical film, an optical film and a touch panel, a front surface protective sheet and an image displaying panel, a back surface protective sheet and an image displaying panel, a front surface protective sheet and a touch panel, and a touch panel and an image displaying panel.

More specifically, an optical device can be configured by joining two members selected from an image displaying panel, a touch panel, an optical film, and a front surface or back surface protective sheet via at least one pressure sensitive adhesive material. Note that the adhering method and order are not limited in any way, as adhering one at a time or two at a time is possible. Furthermore, after the two optical device configuring members are adhered together via the curing reactive silicone composition of the present invention or semi-cured product thereof, the composition or semi-cured product can be cured by further irradiating with a high energy beam such as ultraviolet rays or the like from the optical device configuring component side. By adopting the method, the excellent step absorbing performance of the composition of the present invention before curing provides an advantage such as ease of smooth adhering even of an optical device configuring component having recesses and protrusions, or excellent reliability after adhering. Note that the composition of the present invention may be semi-cured by slightly irradiating the composition of the present invention with a high energy beam prior to adhering an optical device configuring member and then completely or finally cured by light shielding treatment to prevent further activation of component (D), adhering the member, then irradiating the composition with the high energy beam again after to further activate component (D).

The material of the front surface or back surface protective sheet is not particularly limited, and examples include: glass; plastics such as polymethyl methacrylates and other (meth)acrylic resins, polycarbonate resins, cycloolef in polymers, triacetyl cellulose and other acetyl cellulose resins, polyethylene terephthalate polyethylene terephthalate, polyethylene naphthalate, polybutylene terephthalate and other polyester resins, polypropylene, polyethylene and other acyclic olefin resins; and mixtures of these plastics.

The front surface protective sheet may be integrated with a touch panel, and, for example, may be a touch-on-lens (TOL) type or one-glass solution (OGS) type. Furthermore, the front surface protective sheet may have a printed step part printed in a frame shape on a periphery thereof.

For example, in a display screen of a mobile phone or the like, as a result of adopting a configuration where a front surface protective sheet is generally laminated on a functional film such as a touch panel or the like via a pressure sensitive adhesive sheet, a printed section for concealing (thickness: approximately 5 μm to 80 μm) is attached to the peripheral part on a back surface of the protective sheet. Moreover, when a pressure sensitive adhesive does not sufficiently penetrate into a corner part of the stepped part formed at an edge of the printed part for concealing, air bubbles remain and the visibility of the screen is reduced. Furthermore, there was a risk that a film member would bend near the step, resulting in inferior appearance, or that a residual strain caused by bending of the film would be a starting point for foaming or releasing between the laminated members. The composition of the present invention can fill every corner of the step of approximately 5 μm to 20 μm, as well as a step of approximately 50 μm to 80 μm, and can be adhered without residual air bubbles. Moreover, even if one of adherend is a flexible film member, a surface can be smoothly leveled without distorting by hot melting the composition of the present invention, such that the member can be adhered and integrated without causing distortion or deformation of the film member.

The touch panel is not particularly limited and may be any of a resistive film system, a capacitive system, an electromagnetic induction system, a combination thereof, and the like. The touch panel is preferably provided with at least one of transparent electrode layer such as a cover film, ITO, ATO film, or the like, or a glass substrate. The touch panel may further contain a decorative film or the like.

The image displaying panel is not particularly limited so long as image information is displayed. For example, in the case of a liquid crystal display, the image displaying panel is configured from a polarizing film, a phase difference film, a color filter, an enlarged viewing angle film, a brightness enhancing film, a reflection sheet, or other optical film, a liquid crystal material, a transparent substrate, and a backlight system (Normally, an adhering surface of a pressure sensitive adhesive material to the image displaying panel is an optical film). There are STN, VA, IPS, and other systems depending on a control system of a liquid crystal material, but any method may be used. Furthermore, the image displaying panel may be an in-cell type in which a touch panel function is internally provided in a TFT-LCD, or an on-cell type in which a touch panel function is internally provided between a polarizing plate and a glass substrate provided with a color filter. On the other hand, in the case of an organic LED display, the image displaying panel is configured from an organic LED element substrate or a laminate body of an organic LED element substrate and another optical film and the like.

In this case, the article of the present invention is preferably a display, is more preferably a CRT display, a liquid crystal display, a plasma display, an organic EL display, an inorganic EL display, an LED display, a surface conducting electron emitter display (SED), or a field emission display (FED), and is even more preferably a liquid crystal display or an organic EL display.

The image displaying surface of the display may be flat, curved, or flexed.

The optical display of the present invention may be used, for example, in mobile phones, fixed-line phones, and other communicating devices; tablets, desktops, notebook terminals, and other computer devices; TVs; printers; ATMs (automated teller machines); in-vehicle monitors and navigation systems; digital cameras; video cameras; medical equipment; PDAs (mobile terminals); clocks; electronic papers; CDs, DVDs, and Blue-ray disc players; SSMs, HDs, and other solid-state electronic storage media players; electronic book devices; portable game devices, fixed game devices, and other gaming devices; POS systems; fish finders; automatic ticket vending machine; instrument panels; and other applications.

On the other hand, the base or substrate can be a solar cell, a sealing material layer, a front surface or back surface protective sheet. Therefore, the pressure sensitive adhesive layer can, for example, bond a front surface protective sheet and a solar cell, a back surface protective sheet and a solar cell, a front surface protective sheet and a sealing material layer, a back surface protective sheet and a sealing material layer, and a sealing material layer and a solar cell.

In this case, an article of the present invention is preferably a solar cell module.

[Member for Displaying Panel or Display]

The pressure sensitive adhesive material containing the curing reactive silicone composition of the present invention or a cured product thereof is provided with pressure sensitive adhesion, and thus can be used in the construction and use of laminated touch screens or flat panel displays. As a specific method of use thereof, a conventionally known method of using a pressure sensitive adhesive layer (in particular, silicone PSA) can be used without particular limitation.

For example, the pressure sensitive adhesive material containing the curing reactive silicone composition of the present invention or a cured product thereof can be used as an optically transparent silicone pressure sensitive adhesive film or a pressure sensitive adhesive layer disclosed in Japanese Unexamined Patent Application Publication (Translation of PCT Application) No. 2014-522436, Japanese Unexamined Patent Application Publication (Translation of PCT Application) No. 2013-512326, or the like described above can be used to manufacture displaying devices such as touch panels and the like. Specifically, the cured product containing the organopolysiloxane composition of the present invention can be used as a pressure sensitive adhesive layer or a pressure sensitive adhesive film described in Japanese Unexamined Patent Application Publication (Translation of PCT Application) No. 2013-512326 without any particular limitation.

As an example, a touch panel of the present invention may be a touch panel containing a substrate, such as a conductive plastic film or the like, on which a conductive layer is formed on one surface, and a pressure sensitive adhesive material containing the curing reactive silicone composition of the present invention or a cured product thereof adhered to a surface on a side on which the conductive layer is formed or on an opposite side thereof. The aforementioned substrate is preferably a sheet-like or film-like substrate, and examples include resin films and glass plates. Furthermore, the conductive plastic film may be a resin film or a glass plate, and in particular a polyethylene terephthalate film, with an ITO layer formed on one surface. These are disclosed in the aforementioned Japanese Unexamined Patent Application Publication (Translation of PCT Application) No. 2013-512326 and the like.

In addition, the pressure sensitive adhesive material containing the curing reactive silicone composition of the present invention or a cured product thereof may be used as an adhesive film for a polarizing plate used to manufacture a displaying device such as a touch panel or the like, or may be used as a pressure sensitive adhesive layer used for adhering between a touch panel and a displaying module as described in Japanese Unexamined Patent Application 2013-065009.

[Manufacture and Structure of Laminate Body]

FIG. 1 is a cross sectional view illustrating a laminate body of an embodiment of the present invention. A laminate body 1 of an embodiment of the present invention has a first member 20, a second member 21, and a pressure sensitive adhesive material 15 containing the curing reactive silicone composition of the present invention or a cured product thereof disposed between the two members 20 and 21. In the laminate body 1, the two members 20, 21 are adhered by the pressure sensitive adhesive material 15. The optical members may be transparent or non-transparent, and one or both members may be a single substrate or an optical member that is itself an independent laminate body, such as a backlight unit. Note that a member configuring the laminate body of the present invention is generally provided with a plate shaped portion having a planar expanse, and the plate shaped portion or the member itself may be curved and may have three-dimensional recesses and protrusions derived from an application of the member.

The two optical members 20 and 21 can optionally be combined. The two optical members 20 and 21 may be identical or mutually different.

The members 20, 21 are preferably those commonly used as a component of an optical display. More specifically, the members 20 and 21 are optical members, and can be, for example, a lens (which may be made of resin or glass), an optical sheet like member (including a color filter, a polarizer, a retardation plate, a viewing angle expanding film, a brightness enhancing film, a reflection sheet, and a transparent conductive film), an optical protecting material which may be transparent (a transparent protecting material (transparent protecting film) and the like, which may be made of glass, resin, or a resin coating layer), a front display panel, a touch panel (made of glass or resin), or an ITO or ATO film or other transparent electrode layer. Needless to say, the displaying panel or touch panel surface may be further provided with an optical protecting material. Furthermore, the optical member may be a backlight unit itself containing a light emitting layer and a displaying surface (displaying panel) described later, or may be a member in which the entire optical member is an independent laminated member, or a module in a displaying device such as a touch panel or the like. The adhesive layer 15 made of the present cured product may be further provided inside the optical member. In other words, a concept of the optical member includes image displaying panels, optical panels, front surface panels, backlight units, touch panel units, and the like, as described later.

Materials of the members 20 and 21 are not particularly limited to those commonly used in the aforementioned applications, and examples thereof include glass, indium tin oxide (ITO), and other inorganic optical materials, polycarbonate resins, acrylic resins, epoxy resins, polystyrene resins, polyamide resins, polyimide resins, polyethylene resins, polypropylene resins, polyvinyl chloride resins, polyvinylidene chloride resins, polyvinyl alcohol (PVA) resins, polyethylene terephthalate (PET) resins, cyclopolyolefin resins, polyether ether ketone resins, polyethylene naphthalate (PEN) resins, liquid crystal polyarylate resins, polyamide imide resins, polyethersulfone resins, mixtures thereof, and other organic optical materials.

If heat resistance is particularly required, a polyimide resin, a polyetheretherketone resin, a polyethylene naphthalate (PEN) resin, a liquid crystal polyarylate resin, a polyamide imide resin, a polyethersulfone resin, a mixture thereof, or the like may be used.

On the other hand, in applications where visibility is required, such as display devices and the like, a polypropylene resin, a polystyrene resin, a polyvinylidene chloride resin, a PVA resin, a polycarbonate resin, a PET resin, a PEN resin, a mixture thereof, or the like may be used.

The members 20 and 21 may be subjected to a surface treatment generally applied thereto as a component of an optical display. The surface treatment may be, for example, a primer treatment, a corona treatment, or the like.

If the optical members are mutually different, for example, the two members may peel at an adhesive interface due to a difference in thermal expansion coefficients of the two optical members. However, the curing reactive silicone composition of the present invention can be heated and melted between the members to follow the gaps and recesses and protrusions on the members and then cured, and the cured product thereof is flexible. Therefore, an effect of a thermal expansion coefficient difference can be reduced, and the two members 20 and 21 that are different from each other can be favorably bonded. Therefore, the pressure sensitive adhesive material containing the present invention or a cured product thereof is preferably used for adhering mutually different members, and particularly for adhering organic materials and inorganic materials that have a large difference in the coefficient of thermal expansion.

Note that although the laminate body 1 illustrated in FIG. 1 has two members, the number of members is not particularly limited so long as the laminate body has a plurality of members, and particularly optical members.

The pressure sensitive adhesive material 15 illustrated in FIG. 1 is formed entirely between the two members 20 and 21, but may also be formed in a portion between the two members 20 and 21, for example, into one or a plurality of dot shapes. Furthermore, although the pressure sensitive adhesive material 15 illustrated in FIG. 2 is formed between the two members 20 and 21, the adhesive layer 15 may also be formed on a surface 20b opposite from an adhesive surface 20a of the member 20, on a surface 21a opposite from an adhesive surface 21b of the member 21, or on both surfaces 20b and 21a.

A method of manufacturing a laminate body in an embodiment of the present invention will be described below.

FIG. 2 is a flowchart showing a method of manufacturing a laminate body of an embodiment of the present invention. A method of manufacturing a laminate body of an embodiment of the present invention includes an arranging and adhering step S1 of arranging a curing reactive silicone composition of the present invention on one or both surfaces of at least one of two members, and then adhering the two members through the curing reactive silicone composition, and a curing step S2 of initiating a hydrosilylation reaction by irradiating with a high energy beam such as ultraviolet rays or the like to cure the composition.

In the arranging step S1, the composition of the present invention is disposed on a member using the coating method described above, for example. In the arranging step S1, the composition of the present invention may be disposed on one surface of one of the members. Furthermore, the pressure sensitive adhesive material which is a curing reactive silicone composition of the present invention or a cured product thereof disposed on two surfaces of the member and is not used for adhering with another optical member may be used as an adhesive surface for bonding to a release layer or another member.

Furthermore, in another embodiment, in the arranging step S1, the composition of the present invention may be disposed on one surface of each of the two members.

In the embodiment described above, "one surface" is a surface facing the other optical member.

Furthermore, in another embodiment, in the arranging step S1, the composition of the present invention may also be disposed on another surface positioned opposite from the one surface described above.

FIG. 3 is a conceptual diagram of a method of manufacturing a laminate body, including a heating and melting step. In the aforementioned arranging step S1, when the member 21 has recesses and protrusions and the curing reactive silicone composition of the present invention is molded into a shape such as a sheet or the like and used as the pressure sensitive adhesive material 15, a step may be adopted where of arranging a pressure sensitive adhesive material 15A containing the curing reactive silicone composition of the present invention before heating and melting on the member 21 as illustrated in FIG. 3(A), heating and melting to 80° C. or higher, and then molding the molten product into a specific shape or the like corresponding to a recessed portion of the member 21 or filling a gap on the member 21 not illustrated in the drawings to obtain a pressure sensitive adhesive material 15B having a smooth surface (refer to FIG. 3(B)). Since the pressure sensitive adhesive material of the present invention is heat meltable, the pressure sensitive adhesive material can be easily molded into a desired shape, such as a sheet or the like, and providing such a step has the advantage of filling recesses and protrusions and gaps on the member to form pressure sensitive adhesive surface with excellent followability and flatness if necessary. In particular, even a member having inferior adhesion due to the material of the member, recesses and protrusions, or gaps may be easily adhered to by heating and melting the curing reactive silicone composition of the present invention and arranging the composition thereon, and a pressure sensitive adhesive material layer having even higher strength may be formed by the curing step described below.

In the curing step S2, the composition of the present invention is cured in a low temperature region (15 to 80° C.) including room temperature (25° C.). Note that in the embodiments of the present invention, "low temperature" refers to a temperature range of, for example, 15° C. to 80° C. When the reaction of the composition (including a semi-cured product) of the present invention proceeds in the temperature range of 15 to 80° C., the present composition may suitably be left at or near room temperature range (a temperature range that can be reached without heating or cooling, particularly including a temperature range of 20 to 25° C.), may be cooled to 15° C. to room temperature, or may be heated to room temperature to 80° C.

A method of manufacturing a laminate body in another embodiment of the present invention includes: an arranging step S1 of arranging the curing reactive silicone composition of the present invention on one or two surfaces of at least one member of the two optical members, and then adhering the two optical members together via the curing reactive silicone composition; and a curing step S2 of promoting a hydrosilylation reaction of the composition by allowing to stand or heating after irradiating with the high energy beam to cure the composition.

In the curing step S2, a high energy beam is irradiated. Thereby, the cured product in which the composition of the present invention is cured is obtained. The high energy beam is as described above, and is preferably ultraviolet rays.

[Optical Display]

FIG. 4 is a cross sectional view illustrating an optical display of an embodiment of the present invention. An optical display 200 of an embodiment of the present invention is provided with the aforementioned laminate body 1 and an image displaying panel 201.

The laminate body 1 and the image displaying panel 201 are adhered bother via an adhesive layer (not illustrated). The adhesive layer may contain the curing reactive silicone composition of the present invention or a cured product thereof.

In the optical display 200 illustrated in FIG. 4, the second optical member 21 of the laminate body 1 is in contact with the adhesive layer. In the optical display 200 illustrated in FIG. 4, for example, the first optical member 20 of the laminate body 1 can be a polarizing film and the second optical member 21 can be a phase difference film. Furthermore, in another embodiment, for example, the first optical member 20 of the laminate body 1 can be a polarizing film and the second optical member 21 can be a surface protective film.

The image displaying panel 201 is not particularly limited so long as image information is displayed. For example, in the case of a liquid crystal display (LCD), the image displaying panel 201 is configured from a polarizing film, a phase difference film, a color filter, an enlarged viewing angle film, a brightness enhancing film, a reflection sheet, or other optical film, a liquid crystal material, a transparent substrate, and a backlight system (Normally, an adhering surface of a pressure sensitive adhesive component or a pressure sensitive adhesive layer to the image displaying panel is an optical film). There are STN, VA, IPS, and other systems depending on a control system of a liquid crystal material, but any method may be used. Furthermore, the image displaying panel 201 may be an in-cell type in which a touch panel function is internally provided in a TFT-LCD, or an on-cell type in which a touch panel function is internally provided between a polarizing plate and a glass substrate provided with a color filter. On the other hand, in the case of an organic LED display, the image displaying panel 201 is configured from an organic LED element substrate or a laminate body of an organic LED element substrate and another optical film and the like.

The optical display 200 can be a cathode ray tube (CRT) display or a flat panel display (FPD). Examples of FPDs include LCDs, electrochromic displays (ECD), and other light receiving display devices, organic EL displays, inorganic EL displays, and other field emitting displays (ELD), plasma displays (PDP), surface conducting electron emitter displays (SED), and other field emission displays (FED), and LED displays and other light emitting display devices.

FIG. 5 is a cross sectional view illustrating an optical display of another embodiment of the present invention. An optical display 300A of another embodiment of the present invention is provided with: an image displaying panel 301; the optical member 20; and the adhesive layer 15 made of the curing reactive silicone composition of the present invention or a cured product thereof disposed between the image displaying panel 301 and the optical member 20.

The image displaying panel 301 can be the image displaying panel exemplified by the image displaying panel 201 in FIG. 4.

The optical display 300A can be obtained, for example, by arranging the optical member 20 on one surface 301a of the image displaying panel 301 via a curable layer containing the curing reactive silicone composition of the present invention that has been heated and melted as necessary and then curing by irradiating the curable layer with a high energy beam.

The optical display of the embodiment of the present invention illustrated in FIG. 5 can be obtained, for example, by having a curable layer containing the curing reactive silicone composition of the present invention, which is heated and melted as necessary, formed on one surface 20a of the optical member 20, arranging the optical member 20 on the one surface 301a of the image displaying panel 301 through the curable layer, and then curing by irradiating the curable layer with a high energy beam.

FIG. 6 is a cross sectional view illustrating an optical display of another embodiment of the present invention. An optical display 300B of another embodiment of the present invention is provided with: an image displaying panel 301; a touch panel 302; and the adhesive layer 15 made of the curing reactive silicone composition of the present invention or a cured product thereof disposed between the image displaying panel 301 and the touch panel 302.

The touch panel 302 is not particularly limited and may be any of a resistive film system, a capacitive system, an electromagnetic induction system, a combination thereof, and the like. The touch panel 302 is preferably provided with at least one of transparent electrode layer such as a cover film, ITO, ATO film, or the like, or a glass substrate. The touch panel may further contain a decorative film or the like.

In the optical display of an embodiment of the present invention illustrated in FIG. 6, the visibility of the optical display can be enhanced by adhering or pressure sensitive adhering between a displaying part such as a liquid crystal/organic EL or the like and a display forming member such as a touch panel, cover lens, or the like or between display forming members via the curing reactive silicone composition of the present invention or a cured product thereof.

The curing reactive silicone composition of the present invention has sufficient pressure sensitive adhesion, can achieve high followability to recesses and protrusions of a member by heating and melting, and has a property of quickly curing at a relatively low temperature, and specifically at a temperature of 40° C. or lower, after being irradiated with a high energy beam such as ultraviolet rays or the like. In the optical display of the present invention, deformation and degradation of a thermally unstable material are suppressed, and the cured product does not easily become turbid or colored even when exposed to high temperature and high humidity, thereby improving the reliability of the optical display.

An optical display of an embodiment of the present invention may further be a displaying device provided with:
a shield substrate provided on a surface of a front surface panel facing a displaying surface and having a surface on which a transparent conductive film is formed; and
a structure in which the transparent conductive film and a bezel are electrically connected via a conductive material.

For example, in the displaying device, a shield substrate such as an electro-magnetic interference (EMI) substrate with a conductive layer on one surface can be further inserted between the displaying module and the front surface panel. The shield substrate has an electromagnetic wave shielding function, and therefore prevents the front surface panel from malfunctioning due to electromagnetic waves radiating from the displaying module. Furthermore, a conductive layer made from a transparent conductive film such as ITO or the like is formed uniformly or in a mesh-like manner on one surface of the shield substrate. Furthermore, in order to set the potential of the conductive layer to a GND of the displaying module, an adhesive member or the like disposed in an outer periphery of the bezel can be formed by a conductive adhesive member such as Ag paste or the like, for example. Note that the bezel of the displaying module is made from a metal and is connected to the GND in the displaying module. Herein, by using a conductive material as the adhesive member, the metal bezel and the conductive layer of the shield substrate can be securely connected to the GND, thereby providing a displaying device with strong electromagnetic wave resistance.

FIG. 7 is an exploded perspective view illustrating an optical display of another embodiment of the present invention. FIG. 8 is a partial cross sectional view illustrating an optical display of another embodiment of the present invention.

As illustrated in FIGS. 7 and 8, a displaying device 400 (optical display) according to the present invention is provided with: a displaying panel 110 having a displaying surface 111; a bezel 120 having a frame part 121 and an opening end 122 inside the frame part 121 and covering a circumferential edge on the displaying surface 111 side of the displaying panel 110 by the frame part 121; a front surface panel 130 provided sandwiching the bezel 120 against the displaying surface 111 side of the display panel 110, a resin member 140 that is directly below the opening end 122 of the bezel 120 and fills a gap 172 generated at an overlapping portion between the bezel 120 and the displaying surface 111 in a direction orthogonal to the displaying surface 111 without any gaps, and an OCR 150 filled between the displaying surface 111 and the front surface panel 130. Herein, the displaying surface 111 refers to an entire surface of the displaying panel 110 on the front surface panel 130 side.

FIG. 8 illustrates a structure in which a dam (resin member) 140 is further provided on the bezel 120, and a space 173 between the bezel 120 and the front surface panel 130 is filled with the OCR 150 made from the present cured product, a so-called two-level dam structure. The resin member 140 under the bezel may be only on an upper or lower level, unlike in the drawing. The displaying panel 110 is mounted on a backlight unit 171, and the bezel 120 and the backlight unit 171 are secured by a mating structure (not illustrated) to configure a displaying module 170. Entire surfaces of the displaying module 170 and the front surface panel 130, such as the touch panel or the like, are all adhered together via the OCR 150.

In the embodiments of the present invention illustrated in FIGS. 7 and 8, the curing reactive silicone composition of the present invention or a cured product thereof can be applied to an inner layer of the front surface panel 130, the OCR 150, the resin member 140 under the bezel (which may be either on an upper or lower level), and the like. Note that although not limited to these applications, a pressure sensitive adhesive material containing the curing reactive silicone composition of the present invention or a cured product thereof can be used for bonding and for filling in or between the members illustrated in FIGS. 7 and 8.

INDUSTRIAL APPLICABILITY

Applications of the curing reactive silicone (organopolysiloxane) composition and a cured product obtained by curing the same of the present invention are in no way limited to the disclosure above, and a pressure sensitive adhesive sheet provided with a pressure sensitive adhesive material containing the curing reactive silicone composition of the present invention or a cured product thereof can be used in various display devices for displaying characters, symbols, and images such as television receivers, computer monitors, monitors for personal digital assistants, monitoring monitors, video cameras, digital cameras, mobile phones, personal digital assistants, displays for instrument panels of automobiles and the like, displays for instrument panels of various equipment, devices, and instruments, automatic ticket machines, automated teller machines, on-board display devices, and on-board transmission screens, and the like. The surface shape of such displaying device may be curved or bent instead of flat, and examples include various flat panel displays (FPDs), curved surface displays used in automobiles (including electric vehicles), aircraft, and the like, and curved surface transmissive screens. Furthermore, these displaying devices can display, on a screen or display, icons for executing functions or programs, notification displays such as e-mail programs or the like, and operation buttons for various devices such as car navigation devices, membranes for speakers, audio devices, air conditioning devices, and the like. A touch panel function that enables an input operation may be added by touching a finger on the icons, notification displays, and operation buttons. As a device, the present invention can be applied to display devices such as CRT displays, liquid crystal displays, plasma displays, organic EL displays, inorganic EL displays, LED displays, surface electrolytic displays (SEDs), and field emitting displays (FEDs), or touch panels utilizing the same. Furthermore, the pressure sensitive adhesive material containing the curing reactive silicone composition of the present invention or a cured product thereof has excellent adhesion and viscoelasticity and therefore can be used as a film or sheet-like member that is a member for a transducer such as a membrane for a speaker (including for a sensor, a speaker, an actuator, and a generator). Moreover, the pressure sensitive adhesive material can be used as a sealing layer or adhesive layer for a secondary battery, fuel cell, or solar cell module.

The pressure sensitive adhesive material containing the curing reactive silicone composition of the present invention or a cured product thereof may be essentially transparent, does not cause any problems curing defects or reduced curability, and has excellent adhesion to substrates such as various displaying devices or the like. Therefore, the pressure sensitive adhesive material can be preferably used for a vehicle displaying device with favorable visibility and operability of display contents over a long period of time, and particularly in a vehicle displaying device having a curved screen or a curved display and optionally having a touch panel function. For example, vehicle displaying devices having a curved display surface are disclosed in Japanese Unexamined Patent Application 2017-047767, Japanese Unexamined Patent Application 2014-182335, Japanese Unexamined Patent Application 2014-063064, Japanese Unexamined Patent Application 2013-233852, and the like. However, the pressure sensitive adhesive layer of the present invention can be preferably applied or replaced as a portion or all of an adhesive layer or pressure sensitive adhesive layer in which transparency is required in these documents. Furthermore, it goes without saying that the pressure sensitive adhesive material containing the curing reactive silicone composition of the present invention or a cured product thereof can be used for other known curved surface displaying devices by replacing the adhesive layer or pressure sensitive adhesive layer currently being used that requires transparency. Moreover, the design of the displaying device and the thickness of a member is preferably adjusted by known methods in order to further utilize the advantages of the pressure sensitive adhesive material containing the curing reactive silicone composition of the present invention or a cured product thereof.

Note that the transparent film-like substrate provided with the pressure sensitive adhesive material containing the curing reactive silicone composition of the present invention or a cured product thereof may be used to prevent scratching, staining, fingerprint adhesion, antistatic, anti-reflection, peeping, and the like of these display surfaces.

EXAMPLES

Hereinafter, the present invention will be described in more detail based on examples, but the present invention is not limited to these examples. Furthermore, measurements and evaluations in the Examples were conducted as follows.
[Melt Viscosity of Curing Reactive Silicone Composition]

Using a rheometer (Physica MCR301 manufactured by Anton Paar) at a frequency of 1 Hz, the complex viscosity (Pa·s) at 100° C. was measured and set as the "melt viscosity of the curing reactive silicone composition".
[Shear Adhesive Strength, Elongation, and Elastic Modulus of Curing Reactive Silicone Composition]

A spacer having a thickness of 200 µm and a predetermined amount of a curing reactive silicone composition was arranged between two glass plates (75 mm length×25 mm width×2 mm thickness), which were heated and pressurized above the softening point of the composition by a heat press, and then cooled to 25° C. to prepare a test piece where a cylindrical curing reactive silicone composition (uncured product) having 20 mm diameter×200 µm thickness was sandwiched between two glass plates.

For the test piece, the two glass plates were displaced in a shear direction at a rate of 100 mm/min in accordance with a method stipulated in JIS K 6850, where the "shear adhesive strength (MPa) of the curing reactive silicone composition (uncured product)" was determined from the obtained maximum stress, and the "shear elongation (%) of the curing reactive silicone composition (uncured product)" was determined from the amount of displacement amount at that time. Furthermore, the "shear elastic modulus (MPa) of the curing reactive silicone composition (uncured product)" was determined from the relationship of stress to strain (amount of deformation relative to the thickness of the test piece) at the obtained initial displacement.

[Shear Adhesive Strength, Elongation, and Elastic Modulus of Silicone Cured Product]

A test piece where a cylindrical curing reactive silicone composition (uncured product) having 20 mm diameter×200 μm thickness was sandwiched between two glass plates (length 75 mm×width 25 mm×thickness 2 mm), which was prepared in the same manner as described above.

The test piece was irradiated with ultraviolet rays with a wavelength of 365 nm through a glass plate such that the irradiation dose was 10 J/cm² and then cured for 6 hours at room temperature to prepare a test piece where a cylindrical silicone cured product having a 20 mm diameter×200 μm thickness was sandwiched between two glass plates.

For the test piece, the two glass plates were displaced in a shear direction at a rate of 100 mm/min in accordance with a method stipulated in JIS K 6850, where the "shear adhesive strength (MPa) of the silicone cured product" was determined from the breaking stress, and the "shear elongation (%) of the silicone cured product" was determined from the amount of displacement amount at that time (time of breaking). Furthermore, the "shear elastic modulus (MPa) of the silicone cured product" was determined from the relationship of stress at the obtained initial displacement and stress to strain (amount of deformation relative to the thickness of the test piece).

Examples 1 to 9 and Comparative Examples 1 to 8

Using the following components, the curing reactive silicone compositions of the Examples and Comparative Examples were prepared by uniformly heating and mixing each component in the composition (mass parts) shown in Table 1. In each structural formula, Me represents a methyl group and Vi represents a vinyl group.

The following component was used as component (A).

a1-1: $(Me_3SiO_{1/2})_{0.46}(SiO_{4/2})_{0.54}(HO_{1/2})_{0.05}$ a1-2: $(Me_3SiO_{1/2})_{0.48}(SiO_{4/2})_{0.52}(HO_{1/2})_{0.04}$ a2-1: $(ViMe_2SiO_{1/2})_{0.046}(Me_3SiO(SiO_{1/2})_{0.394}(SiO_{4/2})_{0.56}(HO_{1/2})_{0.05}$

The following component was used as component (B). Furthermore, the following components starting with B'-1 were used as comparative components.

B-1: $ViMe_2SiO(Me_2SiO)_{151}SiMe_2Vi$

B-2: $ViMe_2SiO(Me_2SiO)_{830}SiMe_2Vi$

B'-1: $ViMe_2SiO(Me_2SiO)_{45}SiMe_2Vi$

B'-2: $ViMe_2SiO(Me_2SiO)_{4770}SiMe_2Vi$

The following component was used as component (C).

c1: $Me_3SiO(Me_2SiO)_{30}(MeHSiO)_{30}SiMe_3$ c2: $HMe_2SiO(Me_2SiO)_{24}SiMe_2H$

As component (D), D-1 (methylcyclopentadienyl) trimethyl platinum (IV) D-1 was used.

TABLE 1

Part I

| | | Example 1 | Example 2 | Example 3 | Example 4 | Example 5 | Example 6 | Example 7 | Example 8 | Example 9 |
|---|---|---|---|---|---|---|---|---|---|---|
| Composition | a1-1 | 60 | 60 | 60 | 65 | 55 | — | — | — | — |
| | a1-2 | — | — | — | — | — | 70 | 60 | 80 | 80 |
| | a2-1 | — | — | — | — | 10 | — | 10 | — | — |
| | B-1 | 39.11 | — | — | — | — | — | — | 18.67 | — |
| | B-2 | — | 39.48 | 39.82 | 34.54 | 31.72 | 29.61 | 26.79 | — | 19.73 |
| | B'-1 | — | — | — | — | — | — | — | — | — |
| | B'-2 | — | — | — | — | — | — | — | — | — |
| | c1 | 0.89 | 0.11 | 0.18 | 0.10 | 0.69 | 0.08 | 0.68 | 0.28 | 0.06 |
| | c2 | — | 0.41 | — | 0.36 | 2.59 | 0.31 | 2.53 | 1.05 | 0.21 |
| | D-1 | 0.004 | 0.004 | 0.004 | 0.004 | 0.004 | 0.004 | 0.004 | 0.004 | 0.004 |
| Evaluation results | Sum of components A to C (mass parts) | 100 | 100 | 100 | 100 | 100 | 100 | 100 | 100 | 100 |
| | Melt viscosity @100° C. (Pa · s) | 233 | 318 | 322 | 4.070 | 3.280 | 124 | 171 | 20.100 | 28.100 |
| | Shear adhesive strength of uncured product (MPa) | 0.13 | 0.15 | 0.21 | 0.38 | 0.31 | 0.21 | 0.24 | 0.94 | 1.09 |
| | Shear elongation of uncured product (%) | 124 | 167 | 147 | 125 | 126 | 169 | 169 | 126 | 125 |
| | Shear elastic modulus of uncured product (MPa) | 0.15 | 0.18 | 0.28 | 0.52 | 0.31 | 0.25 | 0.26 | 1.14 | 0.96 |
| | Shear adhesive strength of cured product (MPa) | 1.10 | 0.86 | 0.84 | 0.78 | 0.71 | 0.51 | 1.70 | 1.29 | 1.17 |
| | Shear elongation of cured product (%) | 620 | 1.100 | 800 | 1.420 | 540 | 920 | 1.000 | 168 | 186 |
| | Shear elastic modulus of cured product (MPa) | 0.60 | 0.25 | 0.34 | 0.67 | 0.45 | 0.37 | 0.72 | 1.19 | 1.96 |

Part II

| | | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Composition | a1-1 | 55 | 55 | 55 | 60 | 60 | — | 90 | — |
| | a1-2 | — | — | — | — | — | 65 | — | 90 |
| | a2-1 | — | — | — | — | — | — | — | — |

TABLE 1-continued

| | | | | | | | | | |
|---|---|---|---|---|---|---|---|---|---|
| | B-1 | 42 | — | — | — | — | — | 9.33 | — |
| | B-2 | — | 44.41 | — | — | — | — | — | 9.87 |
| | B'-1 | — | — | — | 37.0 | — | — | — | — |
| | B'-2 | — | — | 44.97 | — | 39.96 | 37.98 | — | — |
| | c1 | 0.64 | 0.12 | 0.03 | 3.0 | 0.04 | 0.02 | 0.14 | 0.03 |
| | c2 | 2.36 | 0.47 | — | — | — | — | 0.53 | 0.1 |
| | D-1 | 0.004 | 0.004 | 0.004 | 0.004 | 0.004 | 0.004 | 0.004 | 0.004 |
| Evaluation results | Sum of components A to C (mass parts) | 100 | 100 | 100 | 100 | 100 | 100 | 100 | 100 |
| | Melt viscosity @100° C. (Pa · s) | 43 | 54 | 1.450 | 11 | 2.510 | 847 | 20.100 | 25.200 |
| | Shear adhesive strength of uncured product (MPa) | 0.03 | 0.05 | 0.05 | 0.04 | 0.25 | 0.03 | Unmeasurable | Unmeasurable |
| | Shear elongation of uncured product (%) | 208 | 208 | 292 | 210 | 208 | 313 | Unmeasurable | Unmeasurable |
| | Shear elastic modulus of uncured product (MPa) | 0.02 | 0.04 | 0.03 | 0.04 | 0.26 | 0.03 | Unmeasurable | Unmeasurable |
| | Shear adhesive strength of cured product (MPa) | 0.91 | 0.56 | 0.26 | 2.28 | 0.29 | 0.09 | Unmeasurable | Unmeasurable |
| | Shear elongation of cured product (%) | 590 | 1.170 | 2.420 | 630 | 1.200 | 4.170 | Unmeasurable | Unmeasurable |
| | Shear elastic modulus of cured product (MPa) | 0.18 | 0.10 | 0.09 | 1.35 | 0.27 | 0.03 | Unmeasurable | Unmeasurable |

The compositions of Comparative Examples 7 and 8 were very brittle (insufficient toughness) at 25° C. and could not be subjected to a shear adhesion test.

[Summary]

The curing reactive silicone compositions of Examples 1 to 9 all had heat meltability and sufficient toughness, functioned as pressure sensitive adhesive materials themselves (unreacted), and quickly formed cured products by irradiating with ultraviolet rays, and the cured product has sufficient pressure sensitive adhesion. Furthermore, the curing reactive silicone compositions and cured products thereof all had moderate viscoelasticity and had sufficient properties for practical use as pressure sensitive adhesive materials. Furthermore, the adhesive strength and elongation are greatly improved after curing, and therefore they are useful as materials for forming elastic pressure sensitive adhesive materials that are temporarily secured between members before curing and are firmly adhered between members by irradiating with a high energy beam such as ultraviolet rays or the like. Furthermore, these curing reactive silicone composition and cured products thereof were transparent and had properties as optically clear adhesives (OCA) or optically clear resins (OCR).

On the other hand, the curing reactive silicone compositions of Comparative Examples 1 to 8, which do not satisfy the requirements of the compositions of the present invention, either did not have sufficient adhesive strength before a curing reaction and could not be used as a hot melt pressure sensitive adhesive material (Comparative Examples 1 to 4 and 6), did not achieve practical pressure sensitive adhesive strength even after a curing reaction (Comparative Examples 3 and 5 and 6), or were very brittle before a curing reaction and could not be used as pressure sensitive adhesives for temporary adhesion and the like (Comparative Examples 7 and 8).

Example 10

A curable reactive silicone composition was prepared in accordance with the following steps 1 to 4 and was made into a sheet.

The configuration of a twin-screw extruder used for sheeting and the overall configuration of sheeting are illustrated in FIGS. 9 and 10.

[Step 1: Step of Mixing Component (A) and Component (B) to Obtain a Hot Melt Solid Fraction]

2.50 kg of xylene, 6.45 kg of component (a1-1) (white solid form at 25° C.), 0.42 kg of component (a2-1) (white solid form at 25° C.), and 3.13 kg of component (B-2) were introduced into a cylindrical metal can (pail can) and then dissolved and mixed at room temperature using a motorized stirring device.

The obtained solution was continuously fed at 10 kg/hr from an introducing part provided most upstream of the twin-screw extruder with continuously rotating screw. Herein, the set temperature of the introducing part was 150° C. At the same time, xylene and the low molecular weight organopolysiloxane components included in the aforementioned components (a1-1), (a2-1), or (B-2) were removed by suctioning from a vent provided in the middle of the twin-screw extruder using a vacuum pump under a vacuum condition of −0.08 MPa. Melted transparent fluid products were obtained continuously from a discharge port most downstream of the twin-screw extruder. This was received in a pail and then cooled and solidified. The heating residue of the obtained solid fraction (200° C., 1 hour) was 99.5 wt. %.

[Step 2: A step of Adding Component (C) and Component (D) to the Hot Melt Solid Fraction Obtained in Step 1, and then Kneading While Heating and mMlting at a Temperature of 120° C. or lower]

A twin-screw extruder with a continuously rotating screw was used to perform a heating and kneading operation by the following method.

A hot melter (VersaPail melter manufactured by Nordson Corporation) was mounted on a pail can filled with the hot melt solid fraction obtained in the aforementioned step 1, and then fed continuously to the twin-screw extruder with a continuously rotating screw at 9.66 kg/hr from line 9A illustrated in FIG. 9. The set temperature of the hot melter was 170° C.

Next, a mixture of components (c1) and (c2) (weight ratio: 0.21:0.79) was continuously fed from line 9B illustrated in FIG. 9 at 0.14 kg/hr. Herein, the set temperature of the introducing part was 150° C.

Then, a master batch containing (methylcyclopentadienyl)trimethylplatinum(IV) as component (D) and component (B2) (containing 0.1 wt. % of component (D)) was continuously fed from line 9C of FIG. 9 at 0.20 kg/hr. Herein, the set temperature of the introducing part was 80° C. Furthermore, a vacuum pump was used to perform de-gassing from a vent provided at a most downstream portion of the twin-screw extruder. A colorless, transparent molten product was obtained from the discharge port most downstream of the twin-screw extruder. The obtained composition was non-fluid and was heat meltable (had hot melt properties) at 25° C.

[Step 3: A Step of Laminating the Mixture after Heating and Melting Obtained in Step 2 Between Films Provided with at Least One Release Surface]

Next, the discharge port most downstream of the twin-screw extruder was set as a T-die, and a device provided with the functions of stretching and laminating a film and performing sheet cutting was installed downstream therefrom, as illustrated in FIG. 10. The molten product discharged from the T-die set at 90° C. was continuously fed between two releasable films (50 micron polyethylene terephthalate coated with a fluorosilicone release agent) and then laminated.

[Step 4: A Step of Stretching the Laminate Body Obtained in Step 3 Between Rollers to Mold a Sheet Having a Specific Film Thickness]

The laminate body obtained in step 3 was stretched between rollers whose temperature was controlled to 90° C. to form a laminate body in which a sheet containing a hot melt curing reactive silicone composition having a thickness of 1 mm was laminated between two releasable films, and then the entire laminate body was cooled by air cooling.

When the release film was separated from the obtained laminate body, a sheet containing a bubble-free, flat, homogeneous, tack-free, transparent, hot melt curing reactive silicone composition could be obtained.

Furthermore, by controlling the thickness between the rollers, a curing reactive silicone composition having a thickness of 500 μm could be formed as a laminate body laminated between two releasable films. Moreover, after cooling the entire laminate body by air cooling, the releasable film was separated from the obtained laminate body, and a sheet containing a flat, homogeneous, tack-free, bubble-free, transparent hot melt curing reactive silicone composition could be obtained.

Similarly, by controlling the thickness between the rollers, a laminate body could be formed, in which curing reactive silicone sheet with a thickness of 300 μm was laminated between two release films.

Examples 11 to 19

The kneaded molten products obtained in Examples 1 to 9 above are laminated between two release films. Next, the laminate body is stretched between rollers whose temperature was controlled to 80° C. to form a laminate body in which a sheet containing a hot melt curing reactive silicone composition having a thickness of 1 mm is laminated between two releasable films, and then the entire laminate body is cooled by air cooling.

When the release film is separated from the obtained laminate body, a sheet containing a bubble-free, flat, homogeneous, transparent, hot melt curing reactive silicone composition can be obtained.

DESCRIPTION OF THE REFERENCE NUMERALS

1 Laminate body
15 Pressure sensitive adhesive material
15A Pressure sensitive adhesive material before heating and melting
15B Pressure sensitive adhesive material after heating and melting (gap fill)
20 First optical member
20a Connection surface
20b Surface
21 Second optical member
21a Surface
21b Surface
120 Bezel
121 Frame part
122 Opening end
130 Front surface panel
140 Resin member (dam), upper and lower levels
150 OCR
170 Displaying module
171 Backlight unit
172 Gap
200 Optical display
201 Image displaying panel
300A Optical display
300B Optical display
301 Image displaying panel
301a Surface
302 Touch panel
400 Displaying device (optical display)
5 T-die
6 Bulk melter
7 Twin screw extruder with T-die
8A Pump
8B Pump
8C Vacuum pump
9A Line 1
9B Line 2
9C Line 3
10A Release sheet
10B Release sheet
11A Stretching roller (may be optionally further provided with temperature control)
11B Stretching roller (may be optionally further provided with temperature control)
12 Film thickness meter
13A Drawing roller
13B Drawing roller
14 Foreign material inspecting machine
15 Sheet cutter

What is claimed is:

1. A curing reactive silicone composition, comprising:
(A) an organopolysiloxane resin containing in a molecule a siloxane unit as expressed by $R_3SiO_{1/2}$, where each R mutually independently represent a monovalent organic group, and a siloxane unit as expressed by $SiO_{4/2}$;
(B) a straight chain or branched organopolysiloxane having at least two groups containing an aliphatic unsaturated carbon-carbon bond in one molecule and a degree of siloxane polymerization within a range of 150 to 1,500;
(C) an organohydrogenpolysiloxane having at least two silicon-bonded hydrogen atoms in one molecule and having a viscosity at 25° C. in the range of 5 to 500 mPa·s; and
(D) a hydrosilylation reaction catalyst that does not exhibit activity without irradiating with a high energy beam, but exhibits activity in a composition by irradiating a high energy beam;

wherein;
the amount of component (A) is 60 mass % to 85 mass % of the total mass of component (A) to component (C),
the amount of component (C) is an amount such that the silicon-bonded hydrogen atoms in component (C) is 0.5 to 2 mols relative to one mol of the total aliphatic unsaturated carbon-carbon bonds in the composition,
the composition is non-fluid at 25° C.,
heat meltability is provided,
the melt viscosity at 100° C. is 100,000 Pa·s or less, and
in a state before a curing reaction, a test piece in which a curable layer with a thickness of 200 μm containing a curing reactive silicone composition is formed between two glass plates is used, and the shear adhesive strength of the curable layer is 0.4 MPa or more, as measured by a method specified in JIS K 6850.

2. The curing reactive silicone composition according to claim 1, wherein at least a portion of component (A) is a curing reactive organopolysiloxane resin containing in a molecule at least a siloxane unit as expressed by (Alk)R'$_2$SiO$_{1/2}$, where Alk mutually independently represent a group containing an aliphatic unsaturated carbon-carbon bond, and R' mutually independently represent a group not containing an aliphatic unsaturated carbon-carbon bond, and a siloxane unit as expressed by SiO$_{4/2}$.

3. The curing reactive silicone composition according to claim 1, wherein component (A) is an organopolysiloxane resin as expressed by general unit formula (R$_3$SiO$_{1/2}$)$_a$(SiO$_{4/2}$)$_b$, where R mutually independently represents a monovalent organic group, a and b are positive numbers, respectively, and a+b=1 and a/b=0.5 to 1.5.

4. The curing reactive silicone composition according to claim 1, wherein at least a portion of component (C) is at least one type selected from:
(c1) organohydrogenpolysiloxanes having at least three silicon-bonded hydrogen atoms in a molecule; and
(c2) straight chain organohydrogenpolysiloxanes having a silicon-bonded hydrogen atom on an end of a molecular chain.

5. The curing reactive silicone composition according to claim 1, wherein the melt viscosity at 100° C. is 10 to 50,000 Pa·s.

6. The curing reactive silicone composition according to claim 5, wherein the melt viscosity at 100° C. is 100 to 10,000 Pa·s.

7. A member, a component, or a sheet, comprising at least the curing reactive silicone composition according to claim 1.

8. A heat meltable pressure sensitive adhesive material, comprising the curable silicone composition according to claim 1.

9. A cured product of the curing reactive silicone composition according to claim 1, optionally cured by irradiating with a high energy beam.

10. The cured product according to claim 9, wherein a cured product layer with a thickness of 200 μm containing the cured product of the curing reactive silicone composition according to claim 1 is formed between two glass plates, and the shear adhesive strength of the cured product layer is 0.4 MPa or more, as measured by a method specified in JIS K 6850.

11. A pressure sensitive adhesive material, comprising a cured product of the curing reactive silicone composition according to claim 1.

12. A member, a component, or a sheet, comprising at least the cured product according to claim 9.

13. A laminate body, comprising a layer or member containing, or comprising a cured product of, the curing reactive silicone composition according to claim 1.

14. The laminate body according to claim 13, comprising a sheet-like member provided with a release layer in at least a portion.

15. The laminate body according to claim 13, which is at least one type selected from displaying devices, electronic components, and solar cell modules.

16. A method of manufacturing the laminate body according to claim 13, comprising melting the curing reactive silicone composition by heating at 80° C. or higher and then molding or filling the molten product.

17. A method of manufacturing the laminate body according to claim 13, comprising arranging the curing reactive silicone composition on at least one member or between members, and then or simultaneously irradiating the curing reactive silicone composition with a high energy beam.

18. A method of manufacturing the laminate body according to claim 13, comprising:
laminating the curing reactive silicone composition or a cured product thereof interposed between members; and
crimping the members by the curing reactive silicone composition or cured product thereof.

19. A method of manufacturing a sheet containing the curing reactive silicone composition according to claim 1, comprising the following steps:
1) Removing an organic solvent from a solution, in which the organopolysiloxane resin of component (A) and a portion or all of a straight chain or branched diorganopolysiloxane of component (B) are dissolved in the organic solvent at a temperature of 150° C. or higher to obtain a hot melt solid fraction;
2) Adding the organohydrogenpolysiloxane of component (C) and the hydrosilylation reaction catalyst of the component (D) to the hot melt solid fraction obtained in step 1), and then kneading while heating and melting at a temperature of 120° C. or lower;
3) Laminating the mixture after heating and melting obtained in step 2) between sheet substrates provided with at least one release surface; and
4) stretching the laminate body obtained in step 3) between rollers to mold a sheet containing a curing reactive silicone composition having a specific film thickness.

* * * * *